(12) United States Patent
Forthaus et al.

(10) Patent No.: US 12,429,530 B2
(45) Date of Patent: Sep. 30, 2025

(54) INTEGRATED TOOL WITH CIRCUIT TRACER, RECEPTACLE TESTER, AND/OR LOAD CONTINUITY TESTER

(71) Applicant: IDEAL Industries, Inc., Sycamore, IL (US)

(72) Inventors: Christopher Gerard Forthaus, Naperville, IL (US); Timothy Tunnell, Sycamore, IL (US)

(73) Assignee: IDEAL Industries, Inc., Sycamore, IL (US)

( * ) Notice: Subject to any disclaimer, the term of this patent is extended or adjusted under 35 U.S.C. 154(b) by 0 days.

(21) Appl. No.: 18/868,318

(22) PCT Filed: May 23, 2023

(86) PCT No.: PCT/US2023/023189
§ 371 (c)(1),
(2) Date: Nov. 22, 2024

(87) PCT Pub. No.: WO2023/230031
PCT Pub. Date: Nov. 30, 2023

(65) Prior Publication Data
US 2025/0180668 A1 Jun. 5, 2025

Related U.S. Application Data

(60) Provisional application No. 63/397,127, filed on Aug. 11, 2022, provisional application No. 63/356,312, (Continued)

(51) Int. Cl.
*G01R 31/67* (2020.01)
*G01R 19/145* (2006.01)
(Continued)

(52) U.S. Cl.
CPC .......... *G01R 31/67* (2020.01); *G01R 19/145* (2013.01); *G01R 19/165* (2013.01); *G01R 31/088* (2013.01)

(58) Field of Classification Search
CPC .... G01R 31/67; G01R 19/145; G01R 19/165; G01R 31/088
(Continued)

(56) References Cited

U.S. PATENT DOCUMENTS 5,825,175 A * 10/1998 Selcuk ................ G01R 15/207
324/127
6,043,640 A * 3/2000 Lauby ................. G01R 15/125
336/175
(Continued)

FOREIGN PATENT DOCUMENTS

| CN | 207067294 U | 3/2018 |
|---|---|---|
| EP | 3552031 B1 | 5/2020 |
| KR | 10-2013-0009349 A | 1/2013 |

OTHER PUBLICATIONS

ISR/KR, International Search Report issued on PCT application No. PCT/US2023/023189, dated Sep. 15, 2023, 2 pages.
(Continued)

*Primary Examiner* — Christopher P Mcandrew
(74) *Attorney, Agent, or Firm* — Greenberg Traurig, LLP

(57) ABSTRACT

Systems and methods, as described herein, relate to a circuit tracer transmitter including an integrated continuity test. In addition, systems and methods, as described herein, relate to communicating data over a conductor that is being tested with a circuit tracer, load continuity tester, and/or an integrated circuit tracer with load continuity tester. In addition, systems and methods, as described herein, relate an integrated receptacle tester in circuit tracing hardware through circuitry and/or logic.

20 Claims, 27 Drawing Sheets

Related U.S. Application Data filed on Jun. 28, 2022, provisional application No. 63/351,153, filed on Jun. 10, 2022, provisional application No. 63/344,922, filed on May 23, 2022.

(51) Int. Cl.
  *G01R 19/165* (2006.01)
  *G01R 31/08* (2020.01)
(58) Field of Classification Search
  USPC .......................................................... 324/500
  See application file for complete search history.

(56) References Cited

U.S. PATENT DOCUMENTS

| | | | | |
|---|---|---|---|---|
| 6,164,226 | A * | 12/2000 | Takei | B60N 2/5883 112/475.08 |
| 7,205,757 | B2 * | 4/2007 | Itoh | G01R 15/202 324/117 R |
| 7,439,726 | B2 * | 10/2008 | Luo | G01R 1/06788 324/149 |
| 7,825,655 | B1 * | 11/2010 | Stabel | G01B 7/14 324/207.15 |
| 8,120,350 | B2 * | 2/2012 | Shah | G01R 1/22 324/126 |
| 2003/0001556 | A1 | 1/2003 | Doany et al. | |
| 2009/0058399 | A1 * | 3/2009 | Wang | G01R 1/22 324/127 |
| 2010/0283491 | A1 * | 11/2010 | Zurek | G01R 27/20 324/127 |
| 2012/0169324 | A1 | 7/2012 | Worones | |

OTHER PUBLICATIONS

ISR/KR, Written Opinion issued on PCT application No. PCT/US2023/023189, dated Sep. 15, 2023, 5 pages.

* cited by examiner

| Base 10 number | Binary (4-digit) | Operation/Function |
|---|---|---|
| 0 | 0000 | Numeric digit 0 |
| 1 | 0001 | Numeric digit 1 |
| ... | ... | ... |
| 9 | 1001 | Numeric digit 9 |
| 10 | 1010 | Indicates amperage measurement |
| ... | ... | ... |
| 14 | 1110 | Indicates voltage measurement |
| 15 | 1111 | Indicates start pulse and end pulse of data sequence |

INTEGRATED TOOL WITH CIRCUIT TRACER, RECEPTACLE TESTER, AND/OR LOAD CONTINUITY TESTER

This application claims the benefit of, and priority to, each and every one of U.S. Provisional Patent Application Ser. No. 63/344,922, filed May 23, 2022; U.S. Provisional Patent Application Ser. No. 63/351,153, filed Jun. 10, 2022; U.S. Provisional Patent Application Ser. No. 63/356,312, filed Jun. 28, 2022; and U.S. Provisional Patent Application Ser. No. 63/397,127, filed Aug. 11, 2022. And the content of all of the aforementioned are expressly incorporated herein by reference in their entireties for any and all non-limiting purposes.

TECHNICAL FIELD

Aspects of the disclosure generally relate to circuit testers and circuit tracing and the managing thereof and more specifically to integrating circuit continuity testing into circuit tracing hardware. Moreover, aspects of the disclosure further relate to methods and systems for communicating data over the conductor that is being tested with a circuit tracer, load continuity tester, and/or an integrated circuit tracer with load continuity tester, as described herein. In addition, aspects of the disclosure further relate to methods and systems for an integrated receptacle tester into circuit tracing hardware through circuitry and/or logic. For purposes of an integrated receptacle tester, a screen display on the transmitter device may include a display with HGN or similar indicators.

BACKGROUND

A continuity tester verifies the presence of a complete path for current flow in conductors being tested. In other words, a continuity tester may be used to identify faults (shorts) or breaks in conductors or wires. When used in conjunction with a circuit tracer to find the location of a fault, a continuity tester is used first to confirm which conductors have the shorted condition (complete path for current flow) and then the circuit tracer transmitter leads are connected to those conductors to transmit a signal through those lines, allowing the circuit tracer receiver to be used to find the location of the fault (e.g., electrical short). This requires two separate devices, a continuity tester and a circuit tracer. In its simplest form, a continuity tester can function with merely a LED and a cell circuit, where the LED is made to switch by passing the cell voltage to the LED via the conductor in question. But if the conductor is not broken, the cell voltage circulates through it and reaches the LED to complete the circuit and illuminates the LED. If the conductor is open internally, the cell voltage is unable to complete the circuit and the LED remains shut OFF, thus indicating an open circuit. However, continuity testers have several drawbacks and operating them can sometimes be inconvenient.

Moreover, receptacle testers are used to verify that correct AC polarity (HNG—i.e., hot-neutral-ground) is present in a wired electrical outlet. It is often a simple standalone tester used to detect some common improper wiring conditions; the tester itself is a small device containing a power plug and several indicator lights.

SUMMARY

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below. Corresponding apparatus, systems, and computer-readable media are also within the scope of the disclosure.

Typically, continuity is tested with a separate meter prior to using a circuit tracer device (e.g., a circuit tracer transmitter along with a tracer receiver) to detect certain faults in the circuit. A circuit tracer transmitter that integrates a continuity tester within the circuit tracer transmitter is beneficial. Integrating a continuity test into a circuit tracer transmitter requires only one device and allows the electrician to transition immediately from a continuity test to transmitting a signal over the affected conductors without removing the transmitter leads. The current within the primary side (e.g., input side) and secondary side (e.g., output side) of a transformer which injects the tracing signal on to the lines being tested will see an increase if the lines being tested are shorted. For example, an AC line and neutral may be tested by injecting a tracing signal to the AC line and neutral and the current within the primary and secondary side of the transformer in the circuit tracer transmitter will see an increase if the AC line and neutral are shorted. This increase in current may be utilized with the current being monitored on the primary side of the transformer, which is isolated from high voltage (e.g., high voltage AC), to detect a short condition on the AC lines. In other words, the current draw from the transformer driver IC will be higher during a short on the lines being tested.

Moreover, a current sensing circuit may be used to detect the current draw of the driver IC or the current draw in other portions of the transmitter circuit to detect the short on the lines being tested. For example, if an increase in current is greater than a predetermined threshold based on the output load, it may be determined that continuity exists between the two lines connected to the test leads on the secondary side of the transformer. In some implementations a continuity alarm and/or other notice may be triggered. In some implementations, the continuity test may run continuously if the lines being tested are not energized. In some implementations the energized/non-energized state of the output lines are detected within the circuit tracer transmitter device by a voltage sensing circuit. For example, whether the lines being tested are energized or non-energized may be determined by a voltage sensing circuit on the high voltage (secondary) side of the transformer. When non-energized, the continuity test may be performed and generate an indication whether continuity exists via visual, audio, or other indications. When energized, the continuity test may not be run.

These features, along with many others, are discussed in greater detail below.

BRIEF DESCRIPTION OF THE DRAWINGS

The present disclosure is described by way of example and not limited in the accompanying figures in which like reference numerals indicate similar elements and in which:

(And FIG. 1A and FIG. 1B are sometimes collectively referred to as "FIG. 1").

(And FIG. 3A, FIG. 3B, and FIG. 3C are sometimes collectively referred to as "FIG. 3").

DETAILED DESCRIPTION

Figure 1A:
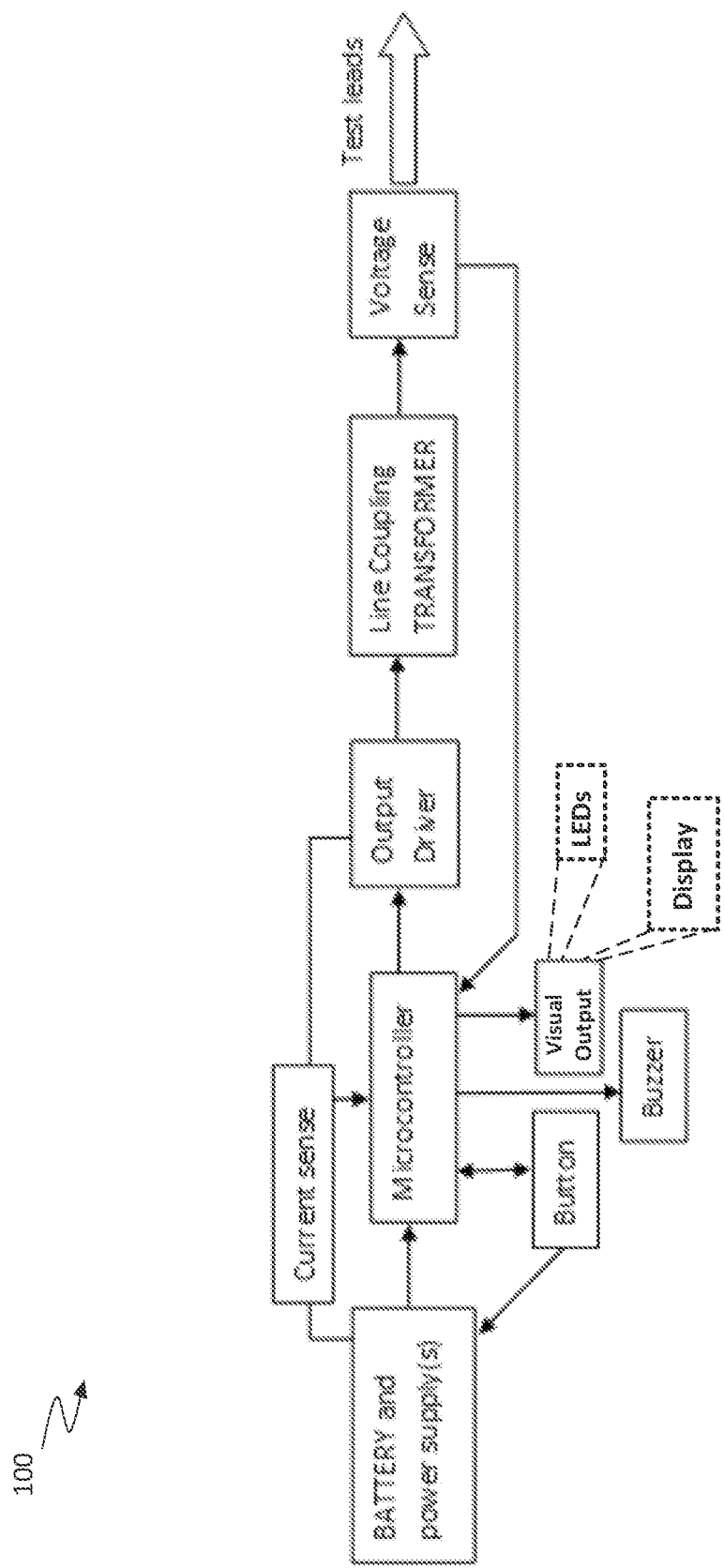
FIG. 1A depicts an illustrative circuit tracer transmitter component diagram that may be used in accordance with one or more illustrative aspects described herein.

In the following description of the various embodiments, reference is made to the accompanying drawings, which form a part hereof, and in which is shown by way of illustration, various embodiments in which aspects of the disclosure may be practiced. It is to be understood that other embodiments may be utilized and structural and functional modifications may be made without departing from the scope of the present disclosure. Aspects of the disclosure are capable of other embodiments and of being practiced or being carried out in various ways. In addition, it is to be understood that the phraseology and terminology used herein are for the purpose of description and should not be regarded as limiting. Rather, the phrases and terms used herein are to be given their broadest interpretation and meaning.

Locating electrical wiring faults (i.e., dead shorts, incorrectly spliced neutrals) in a circuit typically requires a two-step process. The first step requires conducting a continuity check across a set of conductors using an electrical testing device of some type to confirm which conductors are affected. Then the second step requires the connection of signal transmitter onto the affected conductors to send a signal along the conductors to the electrical fault so a signal receiver can identify the location of the fault. The two-step process requires two separate devices and several connections across conductors to determine the affected conductors and correctly connect the signal transmitter to the affected conductors. Current signal transmitter configurations require holding or locating the transmitter somewhere in the vicinity of the conductors while trying to connect the leads to the affected conductors, making it a complex or two-person task. In addition, conventional methods used to test for continuity typically use a method to physically isolate the continuity testing circuitry from the hazardous voltages which creates the need for larger creepage and clearance requirements and requires additional isolation to protect the end-user from electrical shock or arc flash hazards. Generally, circuits must be unenergized for accurate continuity testing because continuity can't be reliably measured when energized and circuit damage may occur if high voltage is connected to the continuity test circuit. Typical continuity tester circuitry may be connected directly to potentially high voltage lines. In order to protect the testing circuit from hazardous voltages, a physical switch may be used to keep the circuitry disconnected when high voltage is present. Additionally, high voltage protection may have to be added to the continuity circuit to protect from accidental exposure to high voltages. This protection may include additional circuitry as well as physical separation to keep parts and connections spaced further apart (creepage and clearance) to prevent arcing. This high voltage protection may have an additional purpose of providing suitable isolation to the end user. For example, traditional continuity testers test for continuity on the live side of the circuitry of the tester.

In order to meet a specified CAT rating (IEC Electrical environmental Category Rating), the continuity tester must be designed and tested to a surge potential defined for each category. These requirements include spacing between tester components on the live side and the housing (creepage distance as discussed above) and between certain electrical internal components (clearance distance as discussed above). The higher the CAT rating, the larger the spacing distances and the larger the tester housing needs to be. In one example, CAT I category may include copiers or other electronic equipment that is low energy equipment with transient limiting protection. Category I may include a signal level for telecommunications, that includes electronic and other low-energy equipment with transient-limiting protection. Peak impulse transient range may be 600-4,000 volts with a 30-ohm source. In another example, CAT II category may include appliances, PCs, and TVs that include outlets and long branch equipment. All outlets are more than 10 m (30 ft) from a Category III source and more than 20 m (60 ft) from a Category IV source. Peak impulse transient range may be from 600-6,000 volts with a 12-ohm source. In another example, CAT III category may include MC Panels and also feeders and short branch circuits, distribution panel devices, and heavy appliance outlets with "short" connections to service entrance. Circuits are separated from CAT IV sources by at least one level of transformer isolation. Peak impulse transient range may be 600-8,000 volts with a 2-ohm source. In a final example, CAT IV category may include exterior transformers and meters and include outside and service entrance, service drop from pole to building, overhead line to detached building and underground line to a well pump. Peak impulse transient range is 600-12,000 volts with less than a 1-ohm source.

The circuits, systems and methods proposed eliminate the need for larger separation requirements; and since the continuity is tested using circuitry on the isolated side, the creepage and clearance requirements are not as great and allow for a smaller tester (smaller tester housing).

A typical circuit tracer transmitter has two leads that are connected to the relevant conductors once the continuity test has been completed with another tester. Circuits, systems, and methods described herein allow those same transmitter leads to be integrated into the voltage detection system within the transmitter, sense a continuity condition and then allow the user to directly proceed with the identification of an electrical shorted fault condition without removing the leads or toggling a switch. This saves the user time and the cost of a separate continuity testing device. The design provides an improved level shock hazard protection, from electrical surges by locating the continuity condition detection circuitry on the isolated (e.g., primary driver) side of the transformer. This also may allow a manufacture to produce the unit within a smaller form minimizing cost and improving ergonomics (grip ability, hand fatigue). With the continuity test on the low voltage side of the transform, low voltage parts may be used with less creepage and clearance. Otherwise, the circuitry would require more spacing (creepage and clearance) as well as the addition of high voltage protection components.

The systems and methods described herein may improve the functionality of testing equipment, e.g., hand-held circuit tracer devices, by adding circuitry and logic to allow for continuity testing A typical circuit tracer transmitter has two leads that are connected to the affected conductors once the continuity test has been completed with another tester. The new design allows those same transmitter leads to be integrated into the transmitter The systems and methods described herein may improve the functionality of testing equipment, e.g., hand-held circuit tracer devices, by adding circuitry and logic to allow for automatic continuity testing. In some implementations, no user-operated switch may be required. For example, while multi-meters can be used for continuity testing, they require the user/operator to switch a dial on the multi-meter device to a continuity tester mode. In some implementations, systems, circuits, and methods as described herein allow for an automatic detection of continuity of a conductor without having to change configurations and/or move test leads for the single/unitary, handheld device to operate as a tracer device performing a non-continuity testing function to help find circuit faults.

The systems and methods described herein may improve the functionality of testing equipment, e.g., hand-held circuit tracer devices, by adding circuitry and logic to integrate continuity testing such that it can simultaneously operate with a tracer device. In some examples, the simultaneous operation of the tracer device with the integrated continuity tester device may be seamless and be triggered/controlled by a voltage detection circuit. When a voltage detection unit in the tracer continuity test transmitter device determines that the voltage detection circuit is outside of a predetermined criteria, then a trigger may execute to disallow the continuity tester device function. In some implementations, the continuity tester function is automatically running anytime there is no trigger to disallow the continuity tester device function.

The systems and methods described herein may improve the functionality of testing equipment, e.g., hand-held circuit tracer devices, by adding circuitry and logic to allow for continuity testing that is functional only when the circuit being tested is de-energized. In some implementations, the circuit being tested is monitored for a threshold voltage and the continuity testing is inhibited if the conductors being tested are energized.

The systems and methods described herein may improve the functionality of testing equipment, e.g., hand-held circuit tracer devices, by adding circuitry and logic to allow for continuity testing by making use of a transformer present in circuit transmitter devices used for circuit tracing. In some implementations, the continuity testing circuitry utilizes the transformer, wherein the current sensing component of the continuity testing circuitry is on the primary side (e.g., a side isolated from potential AC voltage) and not on the secondary (potentially high voltage) side of the transformer.

The systems and methods described herein may improve the functionality of testing equipment, e.g., hand-held circuit tracer devices, by allowing for the driving of a tracing signal into an inductive clamp that may be adjustable affixed (e.g., clamped) around conductors being tested rather than directly, electrically connected. In some implementations, the transmitter device of circuit tracing equipment may be configured so that it can drive a tracing signal into an inductive clamp. That same inductive clamp can also be used as a current transformer to measure current flowing in a conductor (e.g., the conductor being tested). The inductive clamp may be connected in the same manner to the transmitter for either operation, driving a tracing signal or measuring current flowing. The inductive clamp function may allow the induction of a signal over the conductor when the transmitter leads cannot be connected to the conductor(s). A current transformer function may detect, concentrate, and measure the magnetic field being generated by current as it flows through a conductor. This in turn may be converted into an amperage value and, in some implementations, be displayed on a transmitter screen via a wireless signal (e.g., Bluetooth) or via leads connecting the clamp to the transmitter device of the circuit tracing equipment. In some implementations, the clamp may also be independent of the transmitter and receiver, induct a signal over a conductor, be capable of detecting, concentrating, and measuring the magnetic field being generated by current as it flows through a conductor, and then converting the value to amperage. The amperage may be displayed on a screen on a display on the clamp, on a display of the transmitter device, on a display of a corresponding receiver device, or on a mobile device wirelessly sync'd with the clamp.

Circuit Component Block Diagrams. Turning to FIG. 1A, an illustrative circuit tracer transmitter block diagram 100 is depicted that may be used in accordance with one or more illustrative aspects described herein. The blocks may include one or more of a power supply block, a microcontroller block, a current sense block, an output driver block, a line coupling transformer block, and a voltage sense block. Connected to the microcontroller block, a button block, a visual output block, and a buzzer block is depicted. The visual output block may comprise an LEDs block and/or a display block. Displays used as part of the display block may use one or more of enhanced black twisted nematic ("EBTN") liquid crystal technology, liquid crystal display ("LCD") technology, thin-film transistor ("TFT") LCD technology, quantum dot ("QLED") technology, light emitting diode ("LED") technology, organic light-emitting diode ("OLED") technology, and the like.

The power supply block may connect to the microcontroller block and the output driver block. In some implementations, and as depicted, the power supply block may connect to the output driver block through a current sense block. In some implementations, the power supply block may comprise an internal power source (e.g., a battery). In some implementations, the power supply block may be an external power source (e.g., an AC or DC power supply).

A microcontroller block is depicted. In some implementations, the microcontroller may be general purpose processor, a microprocessor, or any conventional processor, controller, microcontroller, or state machine. A processor and/or microcontroller also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. In some implementations, the microcontroller may represent a computing device as depicted and described in relation to FIG. 2. The microcontroller block is depicted as electrically connected to a button block, a visual output block, and a buzzer block.

In some implementations, the microcontroller block is configured to receive an input to enter a continuity test mode. For example, a button press, a long button press, a switched signal, and the like. In some implementations, the microcontroller block may be configured to always be conducting a continuity test when powered on as long as conditions are not contraindicative to the continuity test. For example, a continuity test may be contraindicated if the one or more of the conductive lines being tested are energized. In some implementations, the microcontroller block is configured to determine if two test leads are electrically open or shorted. In some implementations, determining whether the two tests leads are electrically open or shorted may be determined by detecting a current draw on a primary side of a transformer load. For example, a current may be measured that is being drawn by the output driver block that is driving the primary side of the line coupling transformer block. The microcontroller block may be configured to receive a signal indicative of the current being drawn by the output driver block. In some implementations, an analog signal may be received indicative of the current being drawn by the output driver block. In some implementations, a digital signal indicative of the current being drawn by the output driver block may be received. For example, the analog signal may have been process through an analog to digital converter before being received. The microcontroller block may be configured to compare the current being drawn by the output driver block to a threshold level of current, wherein meeting or exceeding the threshold level of current indicates a short and/or continuity between the test leads. In another example, a digital signal indicative of the current being output by the output driver block to the primary windings of the line coupling transformer block may be used instead. Generally, the microcontroller may be configured to receive current measured anywhere in the circuit on the low voltage, primary driver side of the line coupling transformer block where the current increases when there is a short on the two test leads. The threshold requirements of the current increase may change depending on where the current is being measure.

The microcontroller block may be configured to generate a continuity indication when continuity is detected. In some implementations, the continuity indication may be a visual alert comprising an illuminated component. For example, one or more of a visual output block and/or buzzer block may be use. In some implementations, the continuity indication may be an audio alert comprising an audible sound generated by the buzzer block. For example, an audio alert may be emitted by various sound emitting devices that may include speakers, piezoelectric speakers, piezoelectric buzzers, other buzzers, and the like. In some implementations, one or more sound emitting devices generate an audio alert to indicate a condition that two conductive lines being tested are electrically connected or shorted.

The microcontroller block may be configured to discontinue any active continuity indications if continuity is no longer detected. In some implementations, the continuity indication may be a visual alert comprising an illuminated component. For example, one or more LEDs of LED block may be de-illuminated if currently illuminated to indicate two conductive lines being tested are electrically open. In another example, a display of the display block, may display an indication or stop displaying an indication showing that two conductive lines being tested are electrically open. In some implementations, the continuity indication may be an audio alert comprising an audible sound. For example, an audio alert may be emitted by various sound emitting devices that may include speakers, piezoelectric speakers, piezoelectric buzzers, other buzzers, and the like. In some implementations, the microcontroller block is configured to cease generating an audio alert using the buzzer block if an audio alert is currently present to indicate a condition that two conductive lines being tested are electrically open.

The microcontroller block may be configured to receive an input to discontinue a continuity test mode. In some implementations, the microcontroller block may be configured to determine whether a condition is present in order to end a continuity test mode due to a button press, a long button press, a switched signal, and the like. In some implementations, the microcontroller block may be configured to end a continuity test if conditions are contraindicative to the continuity test. For example, a continuity test may be contraindicated if the one or more of the conductive lines being tested become energized.

In some implementations, a button block comprises one or more input devices (e.g., one or more buttons) for supplying input to the microcontroller block. In some implementations, a button may be used to place the microcontroller block in a mode for continuity testing. For example, a long press on a button may provide an input to the microcontroller block, wherein the microcontroller block is configured to place the circuit tracer transmitter in a continuity testing mode. Another long press on the button may return the circuit tracer transmitter to circuit tracing mode.

In some implementations, a visual output block, may contain one or more of an LEDs block and/or a display block. In some implementations, an LEDs block comprises one or more LEDs to provide one or more visual outputs from the microcontroller block. In some implementations, one or more LEDs of the LEDs block may be configured along with the microcontroller block to indicate an "on" condition of the circuit tracer transmitter device. For example, an LED next to or illuminating a power-on shaped symbol may be illuminated when the circuit tracer transmitter device is on. In some implementations, one or more LEDs of the LEDs block may be configured along with the microcontroller block to indicate one or more conductive lines being tested are energized. For example, an LED next to or illuminating a lightning shaped symbol may be illuminated when one or more conductive lines being tested are energized. In some implementations, one or more LEDs of the LEDs block may be configured along with the microcontroller block to indicate the circuit tracer transmitter device is in a continuity test mode. For example, an LED next to or illuminating a symbol representing a continuity test mode may be illuminated when two conductive lines being tested are determined to have continuity (i.e., are shorted). In some implementations, a display of the display block may be configured along with the microcontroller block to indicate an "on" condition of the circuit tracer transmitter device. In some implementations, a display of the display block may be configured along with the microcontroller block to indicate one or more conductive lines being tested are energized. In some implementations, a display of the display block may be configured along with the microcontroller block to indicate the circuit tracer transmitter device is in a continuity test mode. More generally, a display of the display block may be configured to display images, icons, characters, and/or other visual outputs from the microcontroller block that reflect the various statuses and functionalities of the device. Displays used may be one or more of EBTN, LCD, TFT LCD, QLED, LED, OLED technology and/or any other comparable visual display technology.

In some implementations, an comprises one or more sound emitting devices to provide one or more audio outputs from the microcontroller block. Sound emitting devices, may include speakers, piezoelectric speakers, piezoelectric buzzers, other buzzers, and the like. In some implementations, one or more sound emitting devices of the buzzer block may be configured along with the microcontroller block to indicate a condition that continuity has been detected on two lines being tested by the circuit trace transmitter device. For example, a buzzer may sound when the circuit trace transmitter device has detected continuity on two lines being tested. The microcontroller block may utilize one or more sound emitting devices, (e.g., the buzzer block) for other indications such as power on, power off, switching modes, fault detection, battery low conditions, and the like.

Figure 3A:
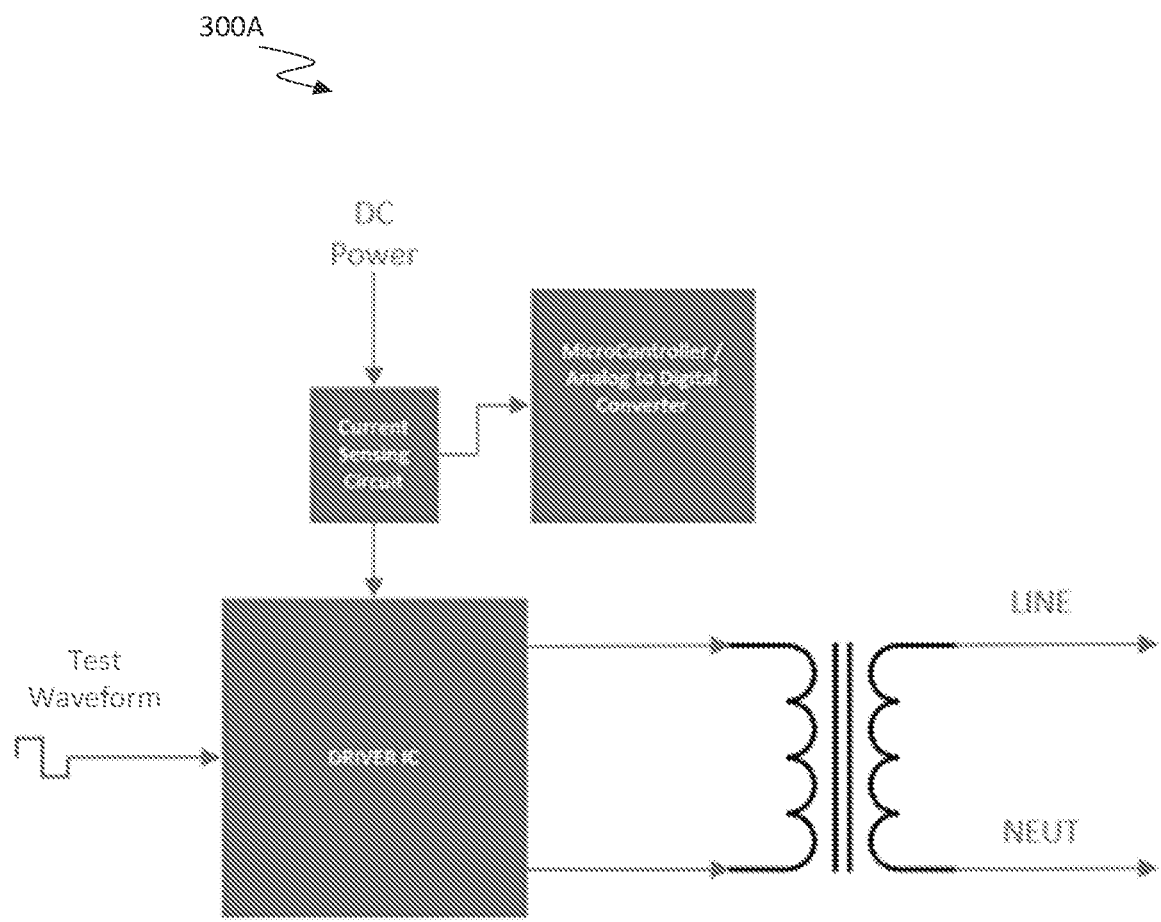
FIG. 3A depicts a circuit block diagram showing circuit components and signals that may be used in accordance with one or more illustrative aspects described herein.

A current sense block is depicted. In some implementations, the current sense block is configured to measure a current being drawn by the output driver block from the power supply block. The current sense block may be configured to send a signal indicative of the current being drawn by the output driver block from the power supply block to the microcontroller block. While the current sense block is shown to be between the power supply block and the output driver block, the current sense block may be positioned in other locations in the circuit that is on the primary driver side of the line coupling transformer block. For example, the current sense block may instead be positioned between the output driver block and the line coupling transformer block to measure a current being output by the output driver block. Other implementations may include other locations for the current sense block such that it may be configured to detect an increase in current draw when the test leads on the secondary driver side of the line coupling transformer block are connected to conductive lines that are shorted. As shown in FIG. 3A, the current sense block may comprise an analog to digital converter to send a digital signal indicative of the current being drawn by the output driver block to the microcontroller. In some implementations, an analog output of the current sense block is connected to an input of an analog to digital converter. The digital output of the analog to digital converter may then be sent to the microcontroller block. In some implementations, the analog to digital converter may be integrated in one of the current sense block and/or the microcontroller block.

An output driver block is depicted. In some implementations, the output driver block drives a signal coming from the microcontroller block to the primary driver side of a line coupling transformer block. As a non-limiting example, a 32 KHz square waveform signal may be input from the microcontroller block to be driven to the primary driver side of a line coupling transformer block. In some implementations, the output driver block comprises a ½ bridge rectifier.

A line coupling transformer block is depicted. In some implementations, the line coupling transformer block is configured to step-up the voltage of an input signal coming from the output driver block using a primary winding on the primary driver side of the circuit to a secondary winding on the secondary driver side of the circuit. The number of turns or coils on each respective side determines the amount the voltage is stepped-up. For example, the turns ratio of a transformer is sometimes referred to as the number of turns on its secondary divided by the number of turns on its primary. The primary driver side of the circuit may in some instances be referred to as the low voltage side herein while the secondary driver side of the circuit may be referred to as the high voltage side. In some implementations, the line coupling transformer block essentially isolates the low voltage side of the circuit from the high voltage side which may be connected to high voltages, e.g., as high as 600 volts.

A voltage sense block is depicted. In some implementations, the voltage sense block is on the high voltage side of the line coupling transformer block and is configured to detect any voltages present that are coming from conductors connected to the test leads of the circuit trace transmitter device. In some implementations, an indication of the voltage is sent back to the microcontroller block and the microcontroller block may inhibit continuity testing when voltage is detected. In some implementations, the voltage sense block is able to conduct voltage measurements up to very high voltages. In one example, the voltage sense block is able to conduct voltage measurements up to 600 volts (RMS). In one example, the microcontroller block may inhibit continuity testing if any voltage is detected to help insure the accuracy of the continuity test. In another example, the microcontroller block may inhibit continuity testing if voltage over a certain threshold is detected.

Figure 1B:
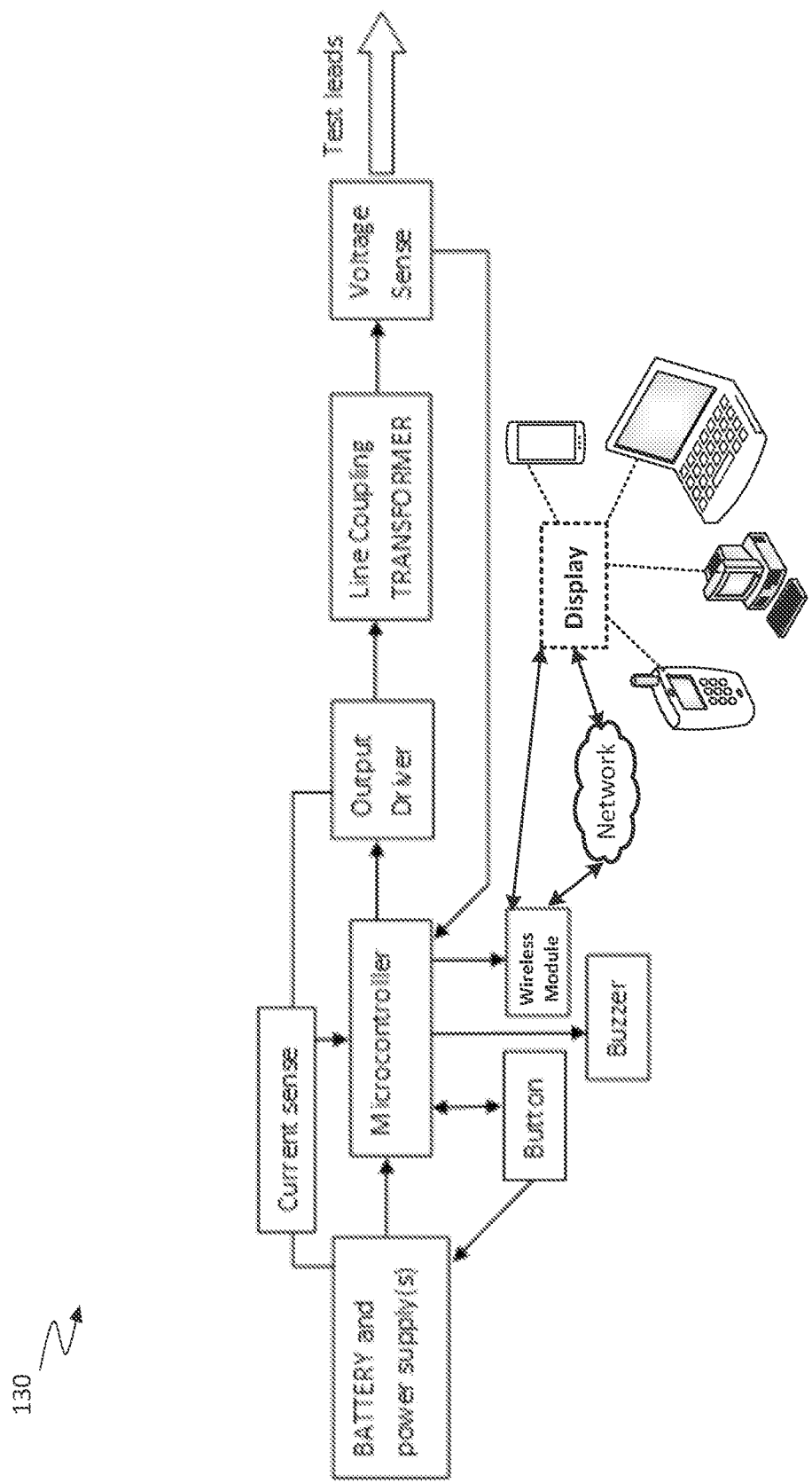
FIG. 1B depicts an illustrative circuit tracer transmitter component diagram with wireless display that may be used in accordance with one or more illustrative aspects described herein.

Turning now to FIG. 1B, an illustrative circuit tracer transmitter block diagram 130 is depicted showing a variation of FIG. 1B where a wireless module block acts as an interface to the visual output sent to a display. In some implementations, the wireless module block is configured to wirelessly communicate through a network (e.g., a wireless Wi-Fi network) to an external display. The external display may be any of the displays as described as part of the display block of FIG. 1A and the like. The external display may be a standalone display or integrated into another device such as a receiver component of a circuit trace device, a display integrated into a clamp of the circuit trace device, a mobile device, a laptop, a desktop, a tablet device, and the like.

The wireless module block may be configured to communicate wirelessly with the display block using one or more of the following communication standards: wireless LAN communication standards; cellular communication standards; short-range wireless communication standards; low-power wireless communication standards; and the like. Examples of wireless LAN standards may include but are not limited to the IEEE 802.11 family of wireless LAN standards commonly known as "Wi-Fi." Examples of cellular communication standards may include but are not limited to any of the 2G, 3G, or 4G generation of cellular communication standards. Examples of short-range communication standards may include but are not limited to the IEEE 802.15 family of wireless communication standards which include implementations commonly known as Bluetooth, ZigBee, and/or any of the near-field communication (NFC) standards. Short-range wireless communication standards may permit maximum wireless ranges of about 1 meter (m) to about 100 m (i.e., about 3.3 feet (ft) to about 330 ft) depending on transmission power. In some implementations, the wireless module block communicates to another device comprising the display block where the devices undergo a unique pairing and/or handshaking on a local Wi-Fi network such that Ethernet packets may then be sent via wireless IEEE 802.11.

In one example, a user of the circuit tracer transmitter illustrated in FIG. 1B may be seated at a testing station in an industrial electronics assembly facility. The facility may be equipped with a Wi-Fi network onto which the aforementioned circuit tracer transmitter may be communicatively coupled through a wireless module, as illustrated in FIG. 1B. The testing station may include a computer monitor equipped with Wi-Fi connectivity. Moreover, the circuit tracer transmitter may omit a sophisticated visual display, and instead, communicate via a wireless module in the circuit tracer transmitter to output visual information (e.g., images, icons, characters, and/or other visual indicators that reflect the various statuses and functionalities) on the computer monitor at the testing station. After a handshake/pairing process, the wireless communications may occur through a network (e.g., a Wi-Fi LAN network) or might occur directly between the wireless module in the circuit tracer transmitter and the computer monitor. In some examples, the visual output to the computer monitor from the circuit tracer transmitter may be recorded and saved as a log memorializing the testing that occurred for a particular electronics assembly being tested at the facility.

Figure 2:
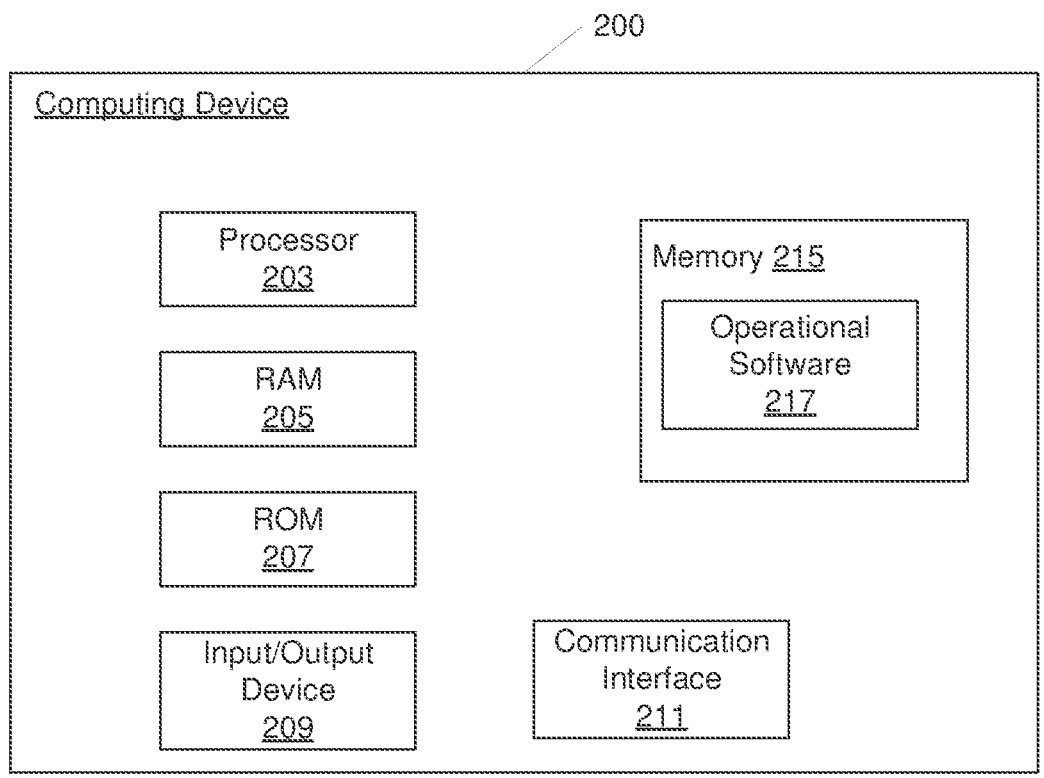
FIG. 2 depicts an illustrative computing system architecture that may be used in accordance with one or more illustrative aspects described herein.

Turning now to FIG. 2, a computing device 200 that may be used as one or more microcontrollers or other processors in the systems described herein is described. The computing device 200 may include a processor 203 for controlling the overall operation of the computing device 200 and its associated components, including RAM 205, ROM 207, input/output device 209, communication interface 211, and/or memory 215. A data bus may interconnect processor(s) 203, RAM 205, ROM 207, memory 215, I/O device 209, and/or communication interface 211. In some embodiments, computing device 200 may represent, be incorporated in, and/or include various devices such as a desktop computer, a computer server, a mobile device, such as a laptop computer, a tablet computer, a smartphone, any other types of mobile computing devices, and the like, and/or any other type of data processing device.

Input/output (I/O) device 209 may include a microphone, keypad, touch screen, and/or stylus through which a user of the computing device 200 may provide input, and may also include one or more of a speaker for providing audio output and a video display device for providing textual, audiovisual, and/or graphical output. Software may be stored within memory 215 to provide instructions to processor 203, allowing computing device 200 to perform various actions. Memory 215 may store software used by the computing device 200, such as operational software 217. The various hardware memory units in memory 215 may include volatile and nonvolatile, removable and non-removable media implemented in any method or technology for storage of information such as computer-readable instructions, data structures, program modules, or other data. Memory 215 may include one or more physical persistent memory devices and/or one or more non-persistent memory devices. Memory 215 may include, but is not limited to, random access memory (RAM) 205, read-only memory (ROM) 207, electronically erasable programmable read-only memory (EEPROM), flash memory or other memory technology, optical disk storage, magnetic cassettes, magnetic tape, magnetic disk storage or other magnetic storage devices, or any other medium that may be used to store the desired information and that may be accessed by processor 203.

Communication interface 211 may include one or more transceivers, digital signal processors, and/or additional circuitry and software for communicating via any network, wired or wireless, using any protocol as described herein.

Processor 203 may include a single central processing unit (CPU), which may be a single-core or multi-core processor, or may include multiple CPUs. Processor(s) 203 and associated components may allow the computing device 200 to execute a series of computer-readable instructions to perform some or all of the processes described herein. Although not shown in FIG. 2, various elements within memory 215 or other components in computing device 200, may include one or more caches.

Although various components of computing device 200 are described separately, the functionality of the various components may be combined and/or performed by a single component and/or multiple computing devices in communication without departing from the invention.

Circuits Related to an Integrated Load Continuity Tester. FIG. 3A depicts a circuit block diagram showing circuit components and signals that may be used in accordance with one or more illustrative aspects described herein. The components may include ore or more of a driver IC component, a current sensing circuit component, and a microcontroller component. The microcontroller component may comprise an analog to digital converter component.

A driver IC component is depicted. In some implementations, the driver IC component receives an input. The input may be from a processor and/or microcontroller (e.g., microcontroller block). A test waveform is depicted. A non-limiting example signal for a test waveform may be a 32 KHz square waveform signal. In some implementations, other signals may be used that may be detected by a receiver component of a circuit trace device paired with the circuit trace transmitter device. In some implementations, the driver IC component comprises a ½ bridge rectifier.

A current sensing circuit component is depicted. In some implementations, the current sensing circuit component is configured to measure a current being drawn by the driver IC component. The current sensing circuit component may be configured to send a signal indicative of the current being drawn by the driver IC component. While the current sensing circuit component is shown to be detecting a current drawn by the driver IC component, the current sensing circuit component may be positioned in other locations in the circuit that is on the primary driver side of the line coupling transformer shown in FIG. 3A. For example, the current sensing circuit component may instead be positioned between the output of the driver IC component and the line coupling transformer to measure a current being output by the driver IC component. Other implementations may include other locations for the current sensing circuit component such that it may be configured to detect an increase in current draw when the test leads on the secondary driver side of the line coupling transformer are connected to conductive lines that are shorted. The current sensing circuit component may comprise an analog to digital converter (shown in drawing as part of the microcontroller) to send a digital signal indicative of the current being drawn by the output driver block to the microcontroller. In some implementations, an analog output of the current sensing circuit component is connected to an input of an analog to digital converter. The digital output of the analog to digital converter may then be sent to a microcontroller. In some implementations, the analog to digital converter may be integrated in the microcontroller (as shown).

A microcontroller component is depicted. As described for FIG. 1A and/or FIG. 1B, in some implementations, the microcontroller may be general purpose processor, a microprocessor, or any conventional processor, controller, microcontroller, or state machine. A processor and/or microcontroller also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. In some implementations, the microcontroller may represent a computing device as depicted and described in relation to FIG. 2.

Further, line and neutral conductors are depicted as an example testing configurations where the testing leads of a circuit tracer transmitter are connected to line and neutral conductors of an AC power line.

Figure 3B:
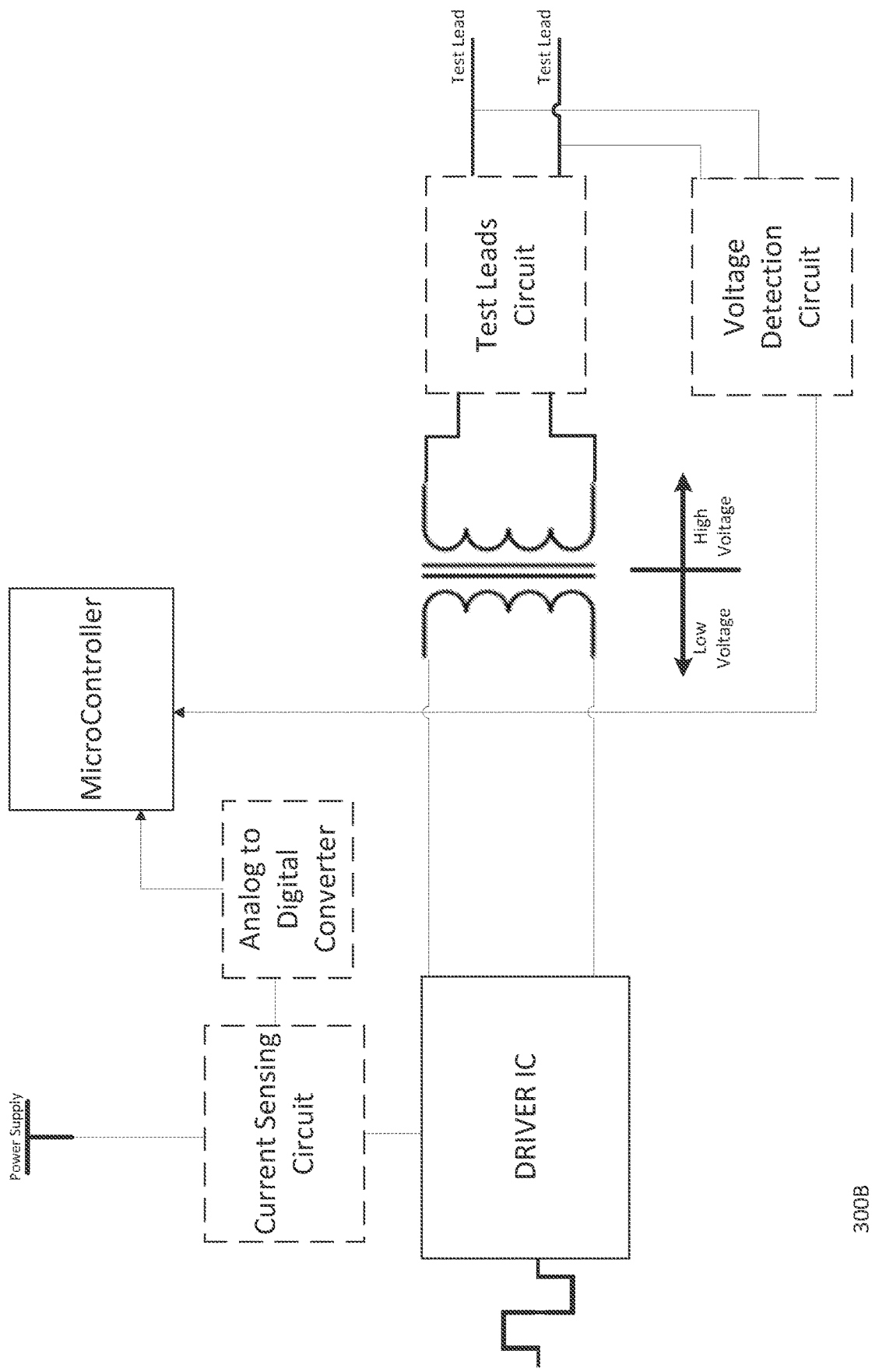
FIG. 3B depicts a detailed circuit block diagram showing one example of a circuit to integrate continuity testing in a circuit tracer transmitter device for use in some implementations.

FIG. 3B depicts a detailed circuit block diagram 300B showing one example of a circuit to integrate continuity testing in a circuit tracer transmitter device for use in some implementations. FIG. 3B depicts a non-limiting example of one design to implement functionality as described in FIGS. 1 and 3A. Although several components and/or sub-circuits are illustrated in FIG. 3B, not all are necessarily required or essential for the operation of all embodiments disclosed, either expressly or implicitly, herein. For example, the current sensing circuit, test leads circuit, and/or voltage detection circuit displayed herein may each be implemented in one of several different ways that will be apparent to a person of skill in the art only after review of the entirety disclosed herein. Meanwhile, the transformer (e.g., line coupling transformer) displayed in FIG. 3B can be implemented with any one of several turns ratios of the transformer based on the voltage step desired of the input signal coming from the output driver block or sub-circuit.

Figure 3C:
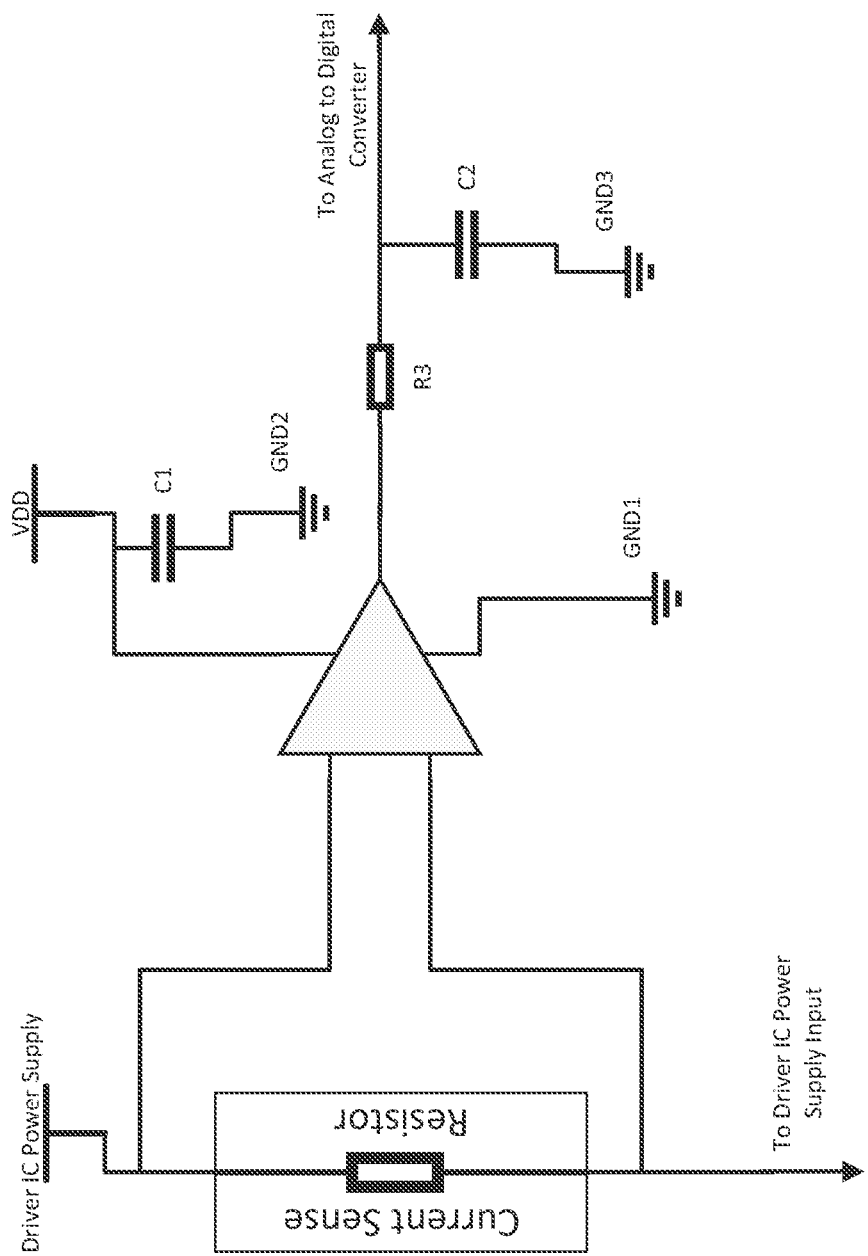
FIG. 3C depicts a detailed circuit block diagram showing one example of a current sensing circuit in a circuit tracer transmitter device for use in some implementations.

FIG. 3C depicts a detailed circuit block diagram 300C showing one example of a current sensing circuit in a circuit tracer transmitter device for use in some implementations. For example, the current sensing circuit is a non-limiting example of one design to implement functionality of the current sensing block of FIG. 3B. Although several components and/or sub-circuits are illustrated in FIG. 3C, not all are necessarily required or essential for the operation of all embodiments disclosed, either expressly or implicitly, herein. For example, a current sense portion of the circuit and an amplification portion of the circuit are depicted, but the current sensing and the amplification may both/either be implemented in one of several different ways that will be apparent to a person of skill in the art only after review of the entirety disclosed herein.

Figure 4:
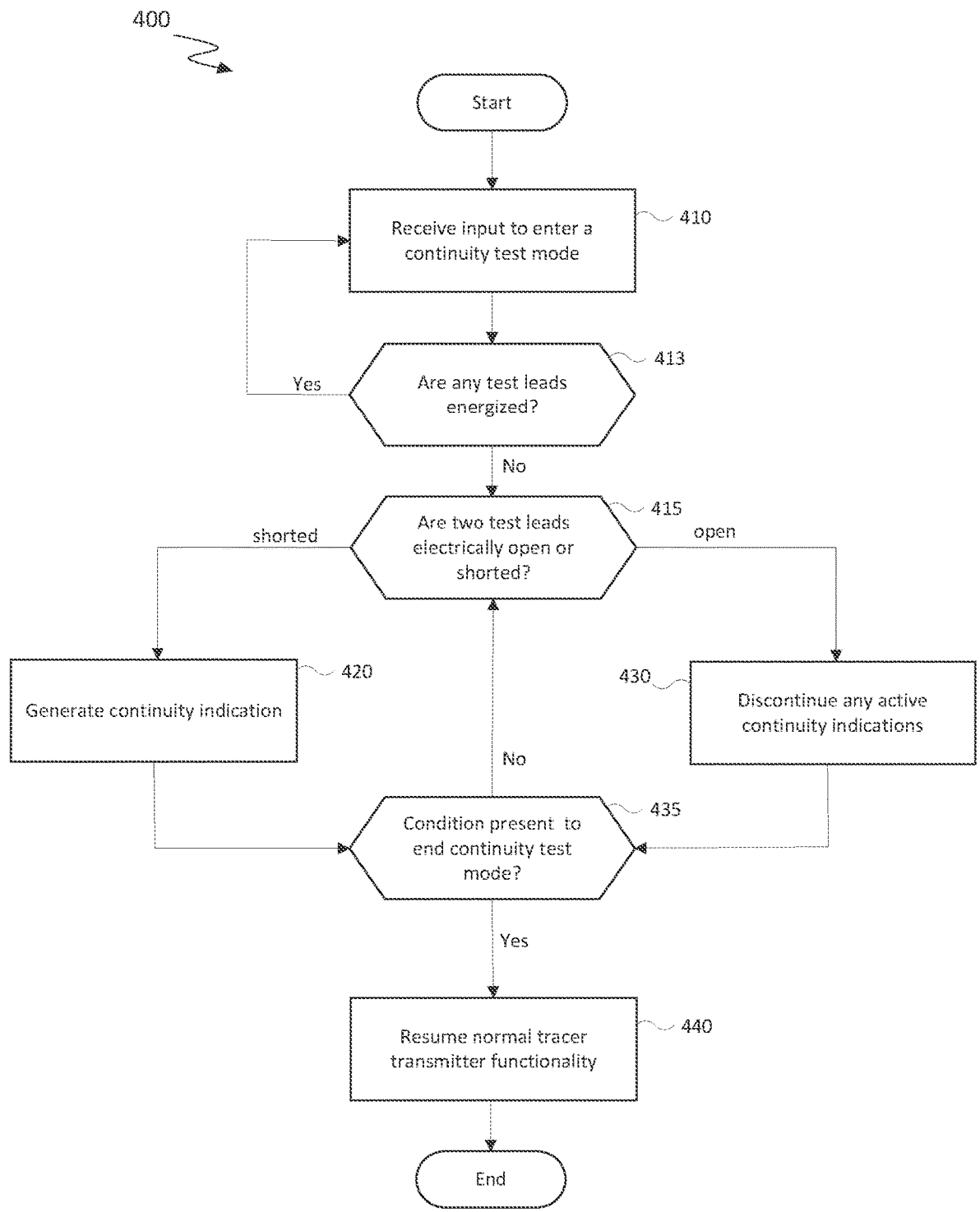
FIG. 4 depicts a flowchart showing an example method for processing a request to digitally sign a transaction for use in some implementations.

Method and/or Algorithm Related to Operation of an Integrated Load Continuity Tester. A continuity test mode may be available in a load continuity tester that is integrated into a circuit tracer transmitter. FIG. 4 depicts a process 400 showing an example method or algorithm for the load continuity tester functionality. The method or algorithm may be used in some implementations as described herein. The method may be implemented or performed, for example, by one or more of the computing devices, whether circuits, microcontrollers, or processors, as discussed in connection with FIGS. 1, 2, 3A, and 3B. The method may be implemented or performed, for example, by one or more microcontrollers as described in FIG. 1A and/or FIG. 1B. The method may be implemented or performed, for example, by one or more computing device(s) 200. The method may be implemented or performed, for example by one or more microcontrollers as described in FIG. 3A or 3B. In some embodiments, the actions in the flowchart may be performed in a different order and with different, fewer, or additional actions than those illustrated in FIG. 4. Actions may be combined and/or divided into sub-actions in some implementations.

Process 400 begins in step 410, where a computing device may enter a continuity test mode (410). In some implementations, an input is received to place the computing device into a continuity test mode. For example, a button press, a long button press, a switched signal, and the like. In some implementations, the computing device may always be conducting a continuity test as long as conditions are not contraindicative to the continuity test. For example, a continuity test may be contraindicated if the one or more of the conductive lines being tested are energized. Therefore, in step 413, the computing device may determine if one or more test leads are electrically energized. For example, the energized/non-energized state of the test leads may be determined by use of a voltage sensing circuit. In some implementations, the voltage sensing circuit may be installed on the high voltage (secondary) side of the transformer where the test leads are. A determination of energized may require the voltage to be above a threshold level of voltage. If one or more test leads are energized (413: YES), the process may return to step 410 and wait to receive an input to enter a continuity test mode. If one or more test leads are note energized (413:NO), the process may proceed to step 415.

In step 415, the computing device may determine if two test leads are electrically open or shorted. In some implementations, determining whether the two tests leads are electrically open or shorted may be determined by detecting a current draw on a primary side of a transformer load. For example, a current may be measured that is being drawn by an output driver IC that is driving the primary side of the transformer load. A signal indicative of the current being drawn by the output driver IC may be received. In some implementations, an analog signal may be received indicative of the current being drawn by the output driver IC. In some implementations, a digital signal indicative of the current being drawn by the output driver IC may be received. For example, the analog signal may have been process through an analog to digital converter before being received. The current being drawn by the output driver IC may be compared to a threshold level of current, wherein meeting or exceeding the threshold level of current indicates a short and/or continuity between the test leads. In another example, a digital signal indicative of the current being output by the output driver IC to the primary windings of a transformer may be used instead. Generally, the current may be measured anywhere in the circuit on the low voltage, primary driver side of the transformer where the current increases when there is a short on the two test leads. The threshold requirements of the current increase may change depending on where the current is being measure. If the two test leads are electrically shorted (415:SHORTED), the process may proceed to step 420. If the two test leads are electrically open (415:OPEN), the process may proceed to step 430.

If the two test leads are electrically shorted (415: SHORTED), the process may proceed to generate a continuity indication (420). In some implementations, the continuity indication may be a visual alert comprising an illuminated component. For example, one or more LEDs may be illuminated to indicate two conductive lines being tested are electrically connected or shorted. In another example, the continuity indication may be a visual alert comprising one or more displays (e.g., a display block) that allows the flexibility to display images, icons, characters on the computing device's display screen(s). For example, a continuity icon or text could be displayed to indicate two conductive lines being tested are electrically connected or shorted. In some implementations, the continuity indication may be an audio alert comprising an audible sound. For example, an audio alert may be emitted by various sound emitting devices that may include speakers, piezoelectric speakers, piezoelectric buzzers, other buzzers, and the like. In some implementations, one or more sound emitting devices generate an audio alert to indicate a condition that two conductive lines being tested are electrically connected or shorted.

If the two test leads are electrically open (415:OPEN), the process may proceed to discontinue any active continuity indications (430). In some implementations, the continuity indication may be a visual alert comprising an illuminated component. For example, one or more LEDs may be de-illuminated if currently illuminated to indicate two conductive lines being tested are electrically open. In another example, the continuity indication may be a visual alert comprising one or more displays that allows the flexibility to display images, icons, characters on the computing device's display screen(s). For example, a continuity icon or text could be un-displayed if currently displayed to indicate two conductive lines being tested are electrically open. In some implementations, the continuity indication may be an audio alert comprising an audible sound. For example, an audio alert may be emitted by various sound emitting devices that may include speakers, piezoelectric speakers, piezoelectric buzzers, other buzzers, and the like. In some implementations, one or more sound emitting devices cease generating an audio alert if an audio alert is currently present to indicate a condition that two conductive lines being tested are electrically open.

In step 435, the computing device may determine if a condition is present in order to end a continuity test mode. In some implementations, determining whether a condition is present in order to end a continuity test mode may be determined by a button press, a long button press, a switched signal, and the like. In some implementations, the computing device may end a continuity test if conditions are contraindicative to the continuity test. For example, a continuity test may be contraindicated if the one or more of the conductive lines being tested become energized. If the condition is not present to end (435: NO), the process may return to step 415 to determine if the two test leads are still either electrically open or electrically shorted. If the condition is present to end (435: YES), the process may proceed to step 440. In step 440, the computing device may resume normal tracer transmitter functionality. In some implementations, resuming normal tracer transmitter functionality involves no longer being in continuity test mode.

One or more aspects discussed herein may be embodied in computer-usable or readable data and/or computer-executable instructions, such as in one or more program modules, executed by one or more computers or other devices as described herein. Generally, program modules include routines, programs, objects, components, data structures, and the like. that perform particular tasks or implement particular abstract data types when executed by a processor in a computer or other device. The modules may be written in a source code programming language that is subsequently compiled for execution, or may be written in a scripting language such as (but not limited to) Python, Perl, or any appropriate scripting language. The computer executable instructions may be stored on a computer readable medium such as a hard disk, optical disk, removable storage media, solid-state memory, RAM, and the like. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects discussed herein, and such data structures are contemplated within the scope of computer executable instructions and computer-usable data described herein. Various aspects discussed herein may be embodied as a method, a computing device, a system, and/or a computer program product.

Figure 5:
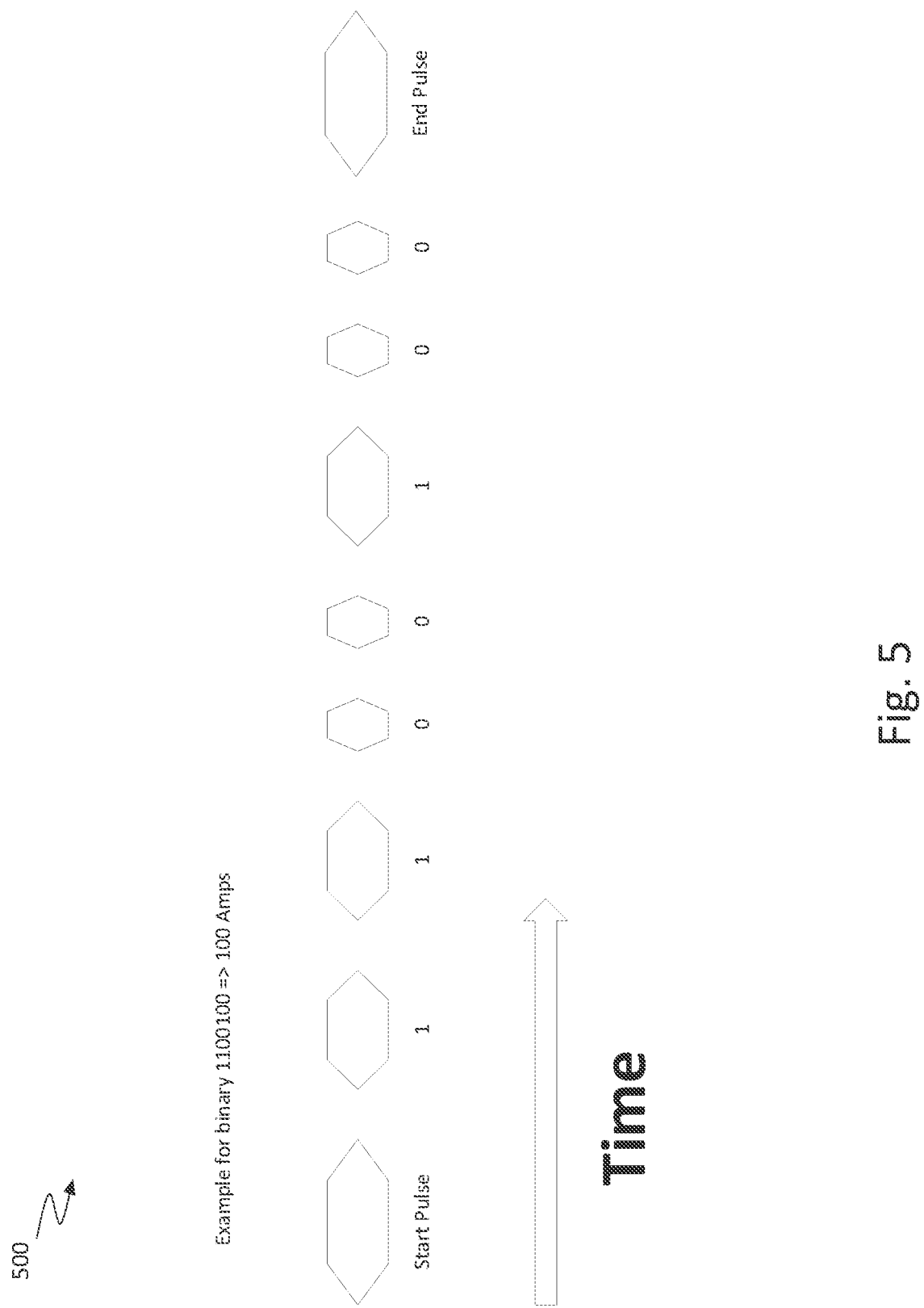
FIG. 5 depicts a diagram of a sequence of data signals transmitted by an induction unit over a conductor being tested for use in some implementations.

FIG. 5 depicts a diagram of a sequence of data signals transmitted by an induction unit over a conductor being tested for use in some implementations. In one embodiment, the induction unit (as illustrated in FIG. 8) is located in an inductive clamp 702. In other examples, the induction unit may be located in a fork meter or other device that uses induction to send a pulse over a conductor that is being tested. The induction unit may induce a signal pulse in the conductor with one or more characteristics so as to convey discernable data. In one embodiment, the characteristics of the signal may involve the width (or duration) of the signal. In other embodiments, the characteristics of the signal may involve something other than or in addition to the duration of the signal. A circuit tracer receiver communicatively coupled to the conductor receives and processes the signal pulses to obtain the data being conveyed. While one simplified example may involve simply inducing a repeated 10 msec duration pulse to indicate that the induction unit detects/measures an energized circuit, or a repeated 20 msec duration pulse to indicate that the induction unit detects/measures a de-energized circuit. The spacing between each, repeated pulse may be 125 msec or some other predetermined/pre-defined value. Any predetermined/pre-defined values may be stored/coded at both the sender and receiver devices. Simply conveying an energized or de-energized status flag to the receiver device, however, does not automatically provide the ability to convey more detailed and/or granular data.

Referring to FIG. 5, that example illustrates that the disclosed system is designed to communicate more sophisticated data using a stream of pulses at varying widths. In a first implementation, the data conveyed may include a current amperage measurement/reading, but other implementations may comprise more and/or other information. For example, a voltage reading or other measurement may be sent as the data conveyed. Such complex measurement values and information cannot be conveyed simply using status flags, such as energized or de-energized. Rather, the sequence 500 of data signals illustrated in FIG. 5 are designed to send, from the inductive clamp/fork (i.e., induction unit) to the circuit tracer receiver, that a 100 Amps measurement was taken at the inductive clamp/fork. The 100 Amps value may be transmitted in some embodiments using binary encoding, which translates to "1100100" in binary. In one example, a unique marker is used to indicate the start pulse and end pulse. That unique marker may be a pulse duration of first predetermined duration (e.g., 30 msec). Meanwhile, a binary one may be indicated by a second predetermined duration (e.g., 20 msec pulse) being induced on the conductor being tested. And a third predetermined duration (e.g., 10 msec pulse) may indicate a binary zero. In some examples, the pulses may be burst at a predetermined frequency (e.g. 32 kHz spaced 100-125 msec apart; a circuit tracer transmitter may send pulses out 8 per millisecond). While illustrative values for pulse duration and frequency have been provided above, the disclosure is not so limited. Other values may be used and are contemplated by the disclosure.

Moreover, the predetermined values of the duration, frequency, and other characteristics may be adjusted, changed, or otherwise modified by updating the software and/or firmware stored on the various devices 780 communicating in a circuit tracer kit. In some embodiments, an update to the software and/or firmware may be performed on devices through an interface (e.g., a USB port, Bluetooth wireless, etc.) to change the values of the aforementioned characteristics. For example, the value of the start pulse may be modified to 40 msec and the end pulse may be modified to be 50 msec. In some embodiments, a third, fourth, and so on different pulse widths/durations may be used to indicate numeric digits from 0-9. Moreover, in some embodiments, a third, fourth, fifth, sixth, and so on different pulse widths/durations may be used for each pulse width to indicate an ASCII character or other mapping (based on a custom mapping table stored in memory).

Figure 6:
FIG. 6. depicts a mapping table stored in a memory of a plurality of devices in a circuit tracer kit, in accordance with some implementations described herein.

FIG. 6. depicts a mapping table stored in a memory of a plurality of devices in a circuit tracer kit, in accordance with some implementations described herein. The mapping table illustrates that a correspondence is predefined between the data signals transmitted by the inductive clamp/fork (or other induction unit/device inducing a signal on the conductor being tested) and processing done by a receiver device. While FIG. 6 illustrates a 4-digit binary mapping table, the disclosure is not so limited. An 8-digit binary number (or any other number of digits) could alternatively be used to provide a base 10 number of 0-255 (or other range) giving a wider range.

While the mapping table in FIG. 6 illustrates one example of a data communication protocol that may be used in various embodiments disclosed herein, the table may also simply provide current (amperage) measurements without additional processing overhead. For example, the inductor clamp may simply transmit a numeric value between 0-255 indicating that amperage reading taken at an inductor clamp, and provide it to the receiver device. In such an example, the circuit tracer receiver may be pre-programmed to receive the data signal and decode it to a value that is the amperage reading without more. Of course, the disclosure contemplates that if desired, extra binary digits may be added to the stream and predefined at both the send and receiver devices.

However, in some examples, a more robust communication protocol may be defined by a mapping table, as illustrated in FIG. 6. In such an example, similar to FIG. 5, a start pulse and an end pulse may be provided a set definition, such as a binary "1111". Therefore, on the circuit tracer receiver, whenever a sequence of data signals matches the definition of the start pulse or end pulse, the microcontroller at the receiver device processes the content of the subsequent data signals. Moreover, some of the binary values may be mapped to indicate the type of value being provided—for example, a base-10 value of ten may indicate that the subsequent value indicates an amperage measurement from the inductive clamp and not a voltage measurement, or other value. As FIG. 6 illustrates, other operations and functions are contemplated and able to be implemented with the disclosed systems and methods.

In one example, to enable the data communication to be performed without requiring a handshake protocol or as unidirectional communication, an induction unit may be programmed to output a sequence of consecutive base-10 outputs of zero to clear a memory buffer at the receiver device before sending a sequence of two start pulse signals (e.g., a binary value of "1111," twice). As a result, a receiver device may be equipped with a memory buffer of eight binary digits in size to monitor for and trigger the start of a data sequence. For example, first, an induction unit may send "0000" over the conductor, then "1111" and again "1111" to trigger the memory buffer to begin processing the subsequent data signal as the start of the new stream of data. As a result, the sender and receiver need not be synchronized in the transmitting and receiving of a data sequence. Instead, the induction unit can repeatedly transmit the same data sequence to the receiver without requiring the receiver unit to acknowledge receipt or perform any handshake protocol.

Figure 7A:
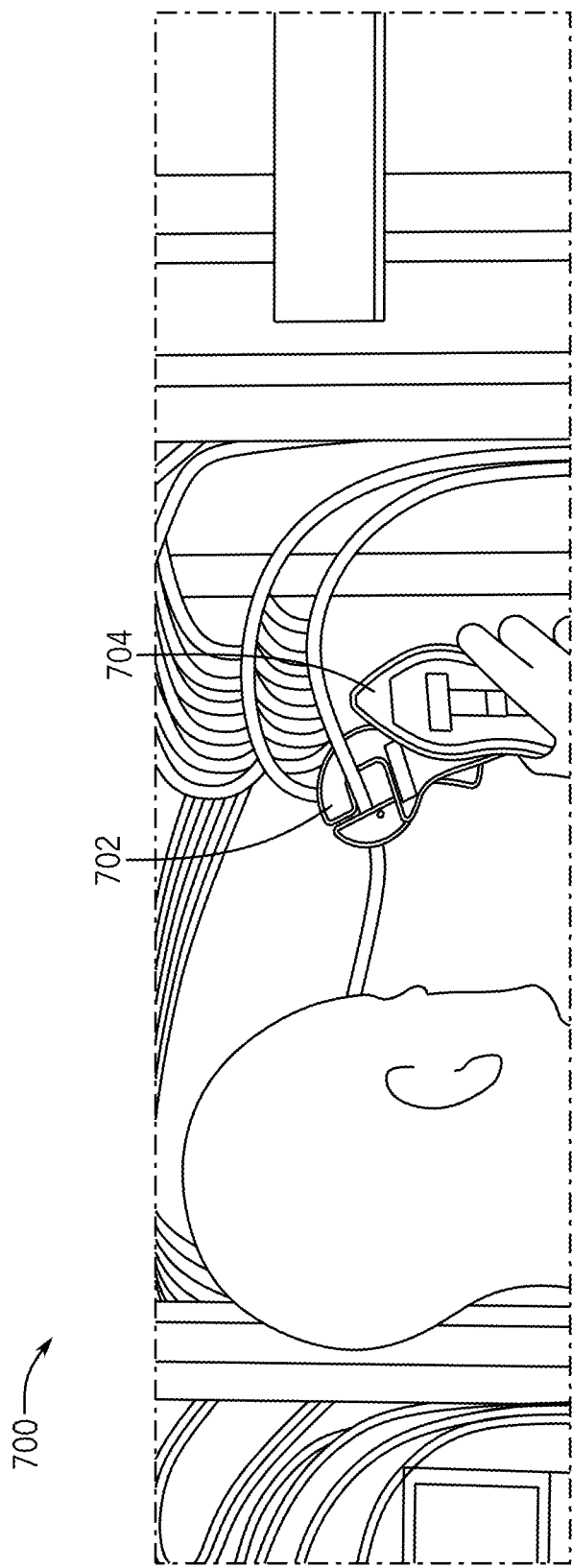
FIG. 7A, FIG. 7B, FIG. 7C, FIG. 7D, FIG. 7E, FIG. 7F, and FIG. 7G (collectively, "FIG. 7") illustrate one or more devices that may be used in a circuit tracer kit in some implementation described herein.

FIG. 7A, FIG. 7B, FIG. 7C, FIG. 7D, FIG. 7E, FIG. 7F, and FIG. 7G (collectively, "FIG. 7") illustrate one or more devices that may be used in a circuit tracer kit in some implementation described herein. Regarding FIG. 7A, the inductive clamp 702 may transmit a sequence of data signals (as illustrated in FIG. 5) to the circuit tracer receiver 704 through the conductor (which is shown as a red wire inside the clamp jaws). The receiver 704 may receive, process, and display the data on its visual display, as illustrated in FIG. 7A. In some embodiments, the visual display may indicate the amperage measured by the inductive clamp. In other embodiments, other measurement values may be displayed. In yet other embodiments, other information conveyed by the inductive clamp might not be displayed but is otherwise processed at the circuit tracer receiver to cause the operation/function of the receiver device to change/adjust as desired.

Notably, the conductor on which the signal pulse is transmitted is the same conductor on which the testing is being performed by the actual circuit tracer kit. In other words, the signal pulse with the data is not solely communicated over a separate channel from the inductive clamp (or circuit tracer transmitter) to a circuit tracer receiver. Rather, the data signal is communicated on the same, live conductor on which the energized (or de-energized, in some embodiments) circuit is being tested by a user.

The inductive clamp 702 is equipped to both induce a signal on an energized/de-energized conductor as well as have the capability to measure amperage and provide other measurement capabilities of a clamp meter (e.g., voltage, continuity, capacitance, diode, resistance, frequency, temperature). The inductive clamp 702 makes the circuit tracer kit more versatile by providing the user (e.g., electrician) with a means to obtain an amperage measurement in addition to a voltage measurement and continuity test, while also providing integrated circuit tracer capabilities. By combining all these capabilities into a kit 780, there is the benefit of eliminating the need to carry/bring/use multiple testers when troubleshooting/servicing electrical systems. While the disclosure contemplates a kit 780 with numerous components, the conductive clamp (or inductive/sensing clamp meter ISCM) may also be providing separately and provide the aforementioned typical clamp meter functions. Moreover, so long any device, regardless of whether it is provided in the kit 780, stores (or is pre-programmed with) the mapping table 600 or predefined configurations (as illustrated in FIG. 5) to process the induced sequence of data communication, that device may be interoperable with the system disclosed herein.

Figure 7B:
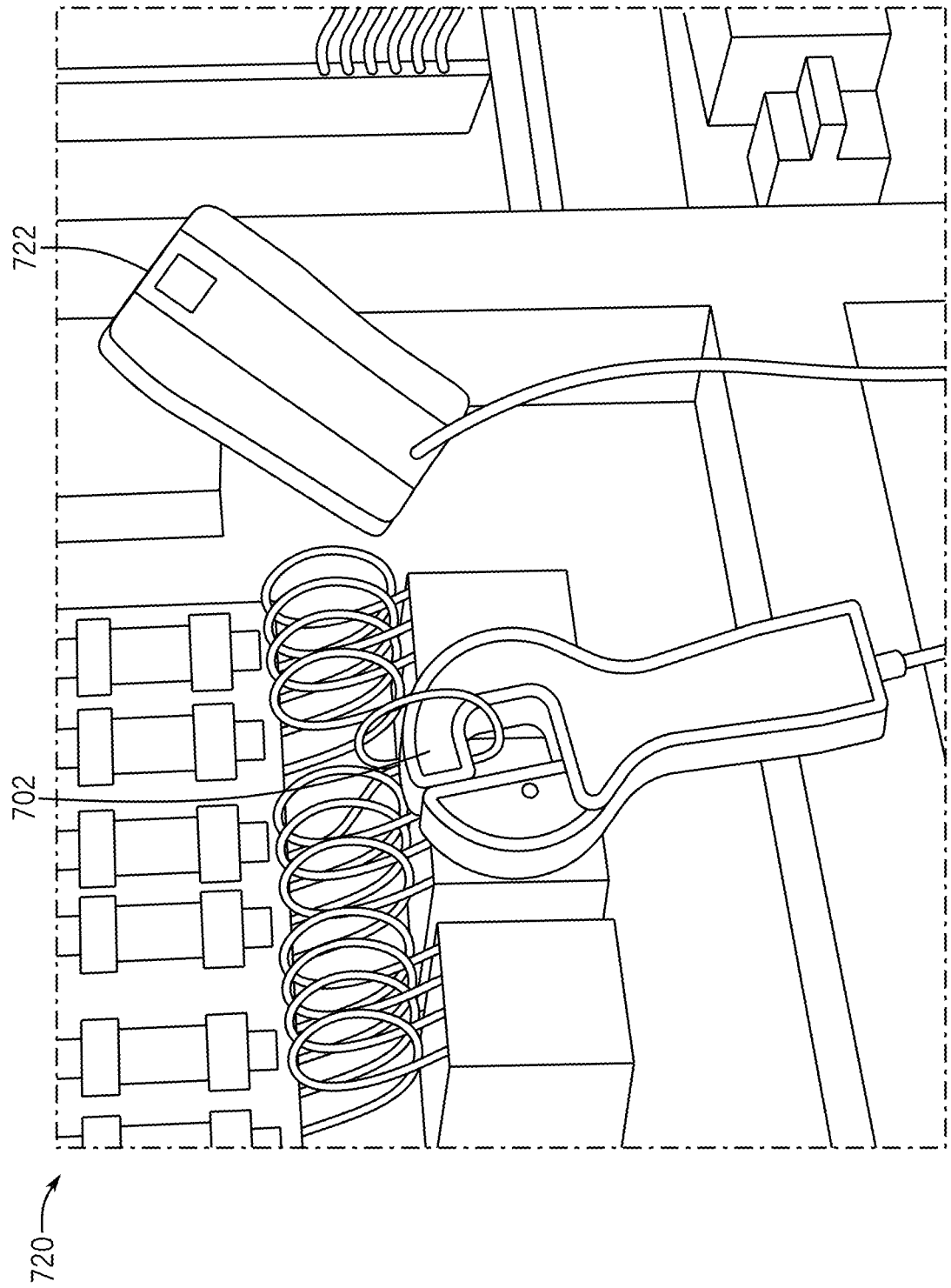
Figure 7C:
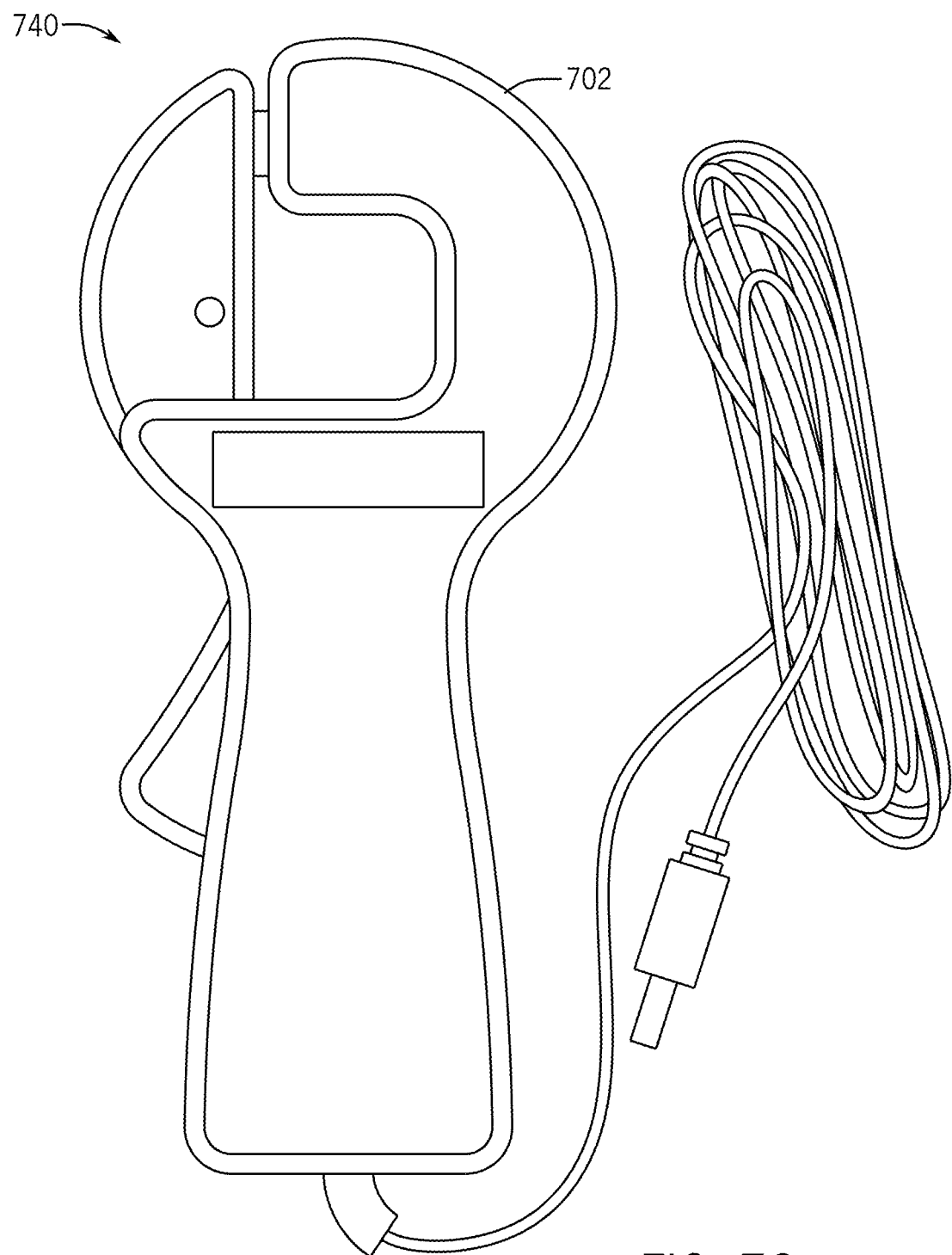
Figure 9A:
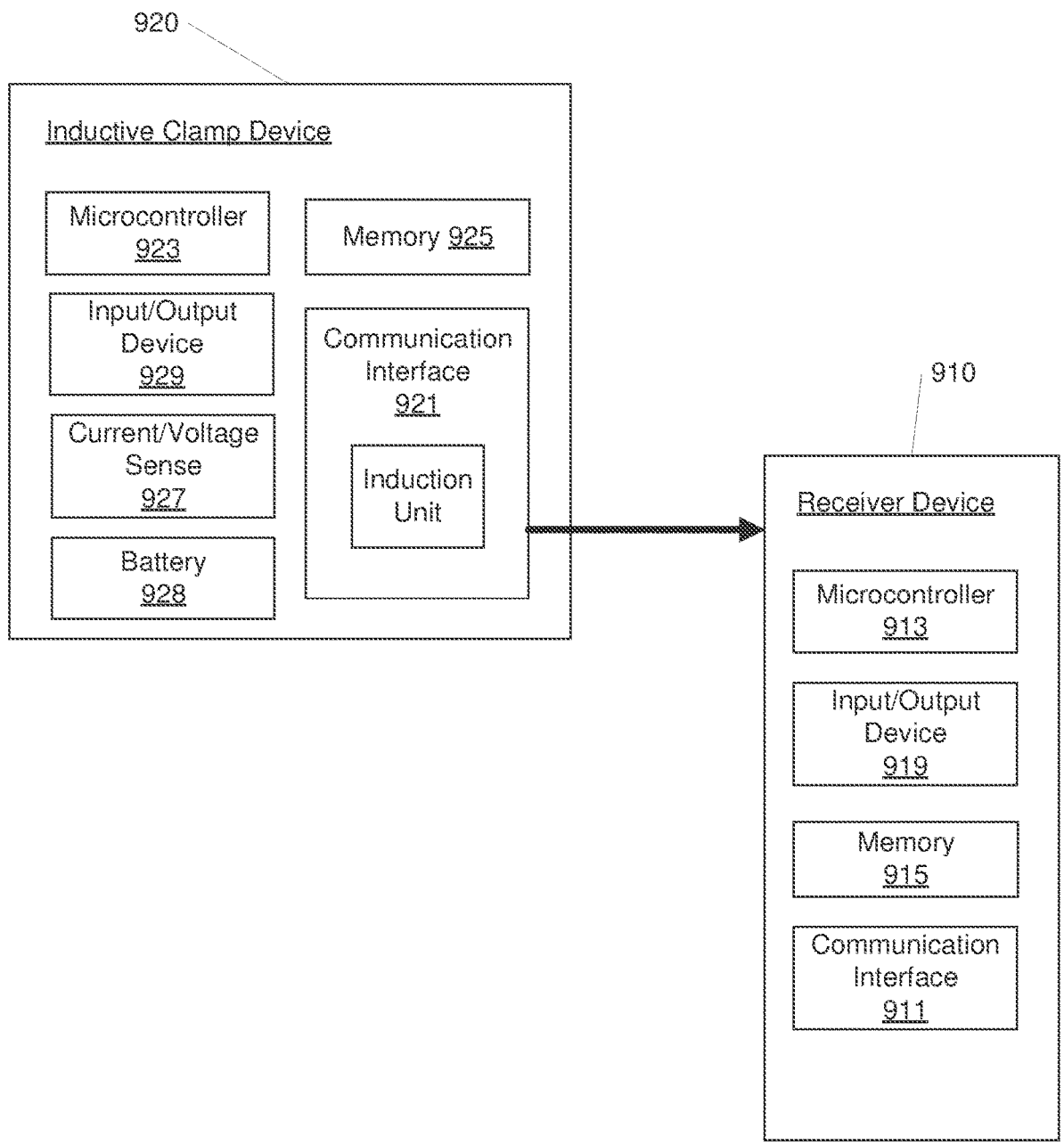
FIG. 9A, FIG. 9B, and FIG. 9C (collectively "FIG. 9") depict a component diagram of an illustrative circuit tracer system that may be used in accordance with one or more implementations described herein.

Regarding FIG. 7B, while an inductive clamp device 920 may be implemented (as illustrated in FIG. 9A) comprising an internal battery 928, in some embodiments, no battery may be included and instead an external battery 722 may be coupled to the inductive clamp 702. This coupling may occur using a wire (as illustrated in FIG. 7C) that connects with the external battery 722. In some embodiments, some of the functionality of the inductive clamp may be shared or offloaded to the external battery 722 for one or more purposes—e.g., to avoid EM interference or other purposes.

Regarding FIG. 7C, an inductive clamp is illustrated for use in systems and methods described herein that may improve the functionality of testing equipment kits, e.g., hand-held circuit tracer devices, by enabling the inductive clamp to drive a tracing signal into a conductor. The inductive clamp may be adjustable affixed (e.g., clamped) around conductors being tested rather than directly, electrically connected. The inductive clamp may also be used as a current transformer to measure current flowing in the conductor being tested. The inductive clamp may be connected in the same manner to the transmitter for either operation, driving a tracing signal or measuring current flowing. The inductive clamp function may allow the induction of a signal over the conductor when the transmitter leads cannot be connected to the conductor(s). A current transformer function may detect, concentrate, and measure the magnetic field being generated by current as it flows through a conductor. This in turn may be converted into an amperage value. In some implementations, the amperage value may be displayed on a screen on a circuit tracer receiver by the value passing as a data signal over the conductor being tested. While other embodiments may use a wireless signal (e.g., Bluetooth) or a wired connection other than the conductor being tested, at least one benefit of using the conductor is that it does not require additional materials or components to transmit and/or over which to transmit. The conductor is inherently and necessarily present in any scenario using a circuit tracer kit.

Figure 7D:
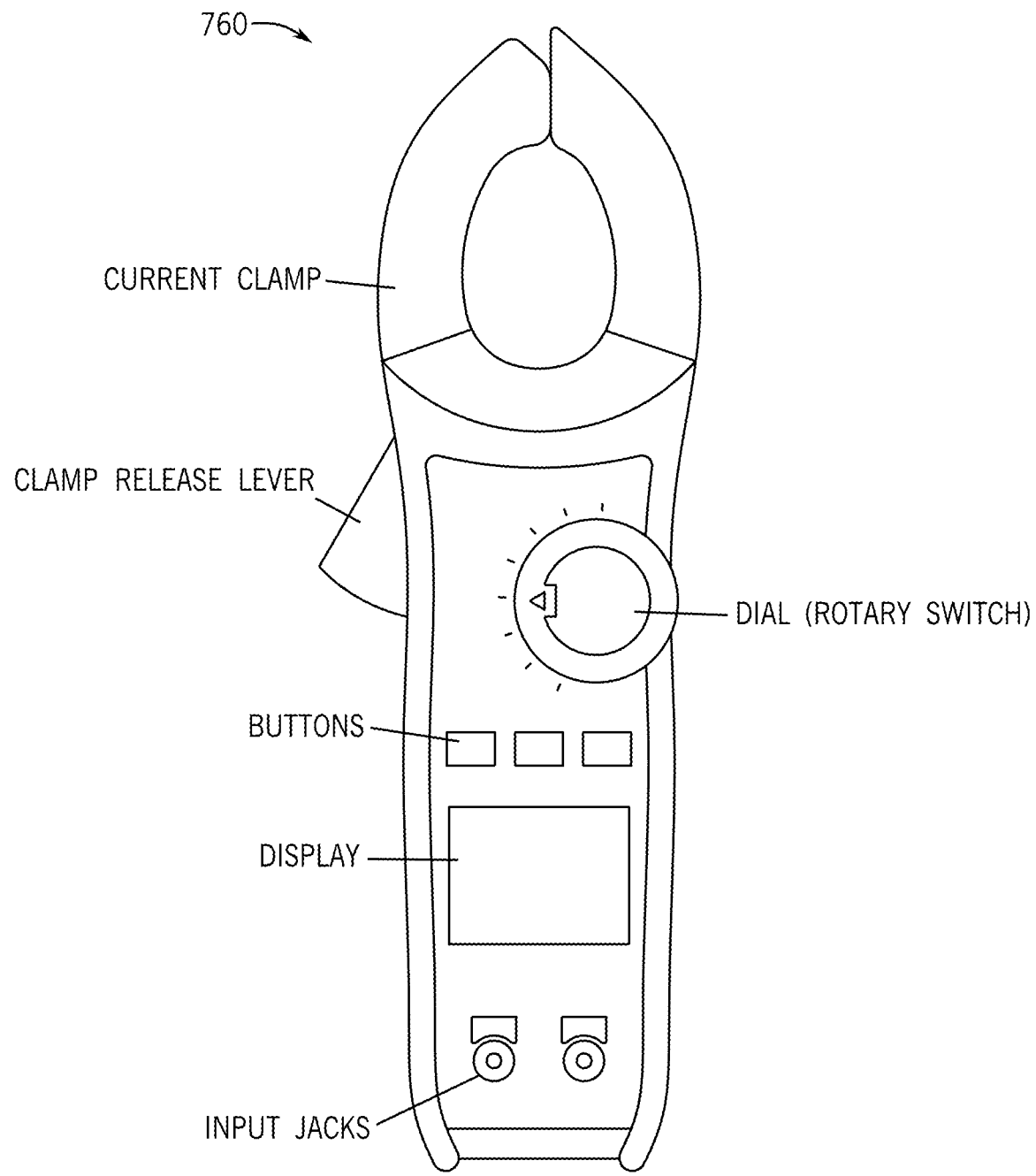

Regarding FIG. 7D, in some embodiments, a digital clamp meter may include six (or more or less) components, including but not limited to: (i) current clamp (sensor); (ii) clamp release lever; (iii) dial (or rotary switch) for selecting primary measurement values (volts, amps, ohms); (iv) one or more buttons for selecting various functions; (v) an optional display where measurement readouts can be viewed; and/or (vi) optional input jacks where test leads may be inserted. The test leads may be flexible, insulated wires (e.g., red-colored for positive, black-colored for negative) that plug into or connect with input jacks on a clamp meter. They may serve as the conductor from the item being tested to the clamp meter. The probe tips on each lead may be used for testing circuits, and sometimes may include removable probe CAT covers. A hinged jaw integrated into a clamp meter's design allows a user (e.g., an electrician) to clamp the jaws around a conductor in an electrical system, then measure current in that system, without disconnecting/de-energizing it. A clamp meter 760 includes electronics for sensing (e.g., measuring) the characteristics of the conductor that passes through its jaws/clamp, but typically does not include any electronics for inducing a signal (e.g., tracing signal or data signal) in the conductor. In contrast, the inductive clamp 920 in this disclosure (illustrated in FIG. 9) includes an induction unit that comprises both the electronics for sensing and electronics for driving the induction of a signal on the conductor being tested.

Moreover, like an inductive clamp illustrated in FIG. 7D, the disclosure contemplates other inductive devices that can be used and implemented in accordance with the disclosed systems and methods herein. For example, a fork meter may be interchangeably used where an inductive clamp is described herein. Like a clamp, a fork tool operates by using a ferrite iron (AC/DC) or enameled coil core (AC) jaws to measure current carried in a conductor positioned inside the fork. Unlike a claim, the jaws of a fork tool are not fully enclosed (i.e., have a U-shaped opening on one end) so that a conductor may be readily inserted between the jaws of the fork. Both induction units operate, in some embodiments, using Hall effect sensors (e.g., semiconductors) mounted on the tool, as illustrated in FIGS. 8B and 8C.

Figure 7E:
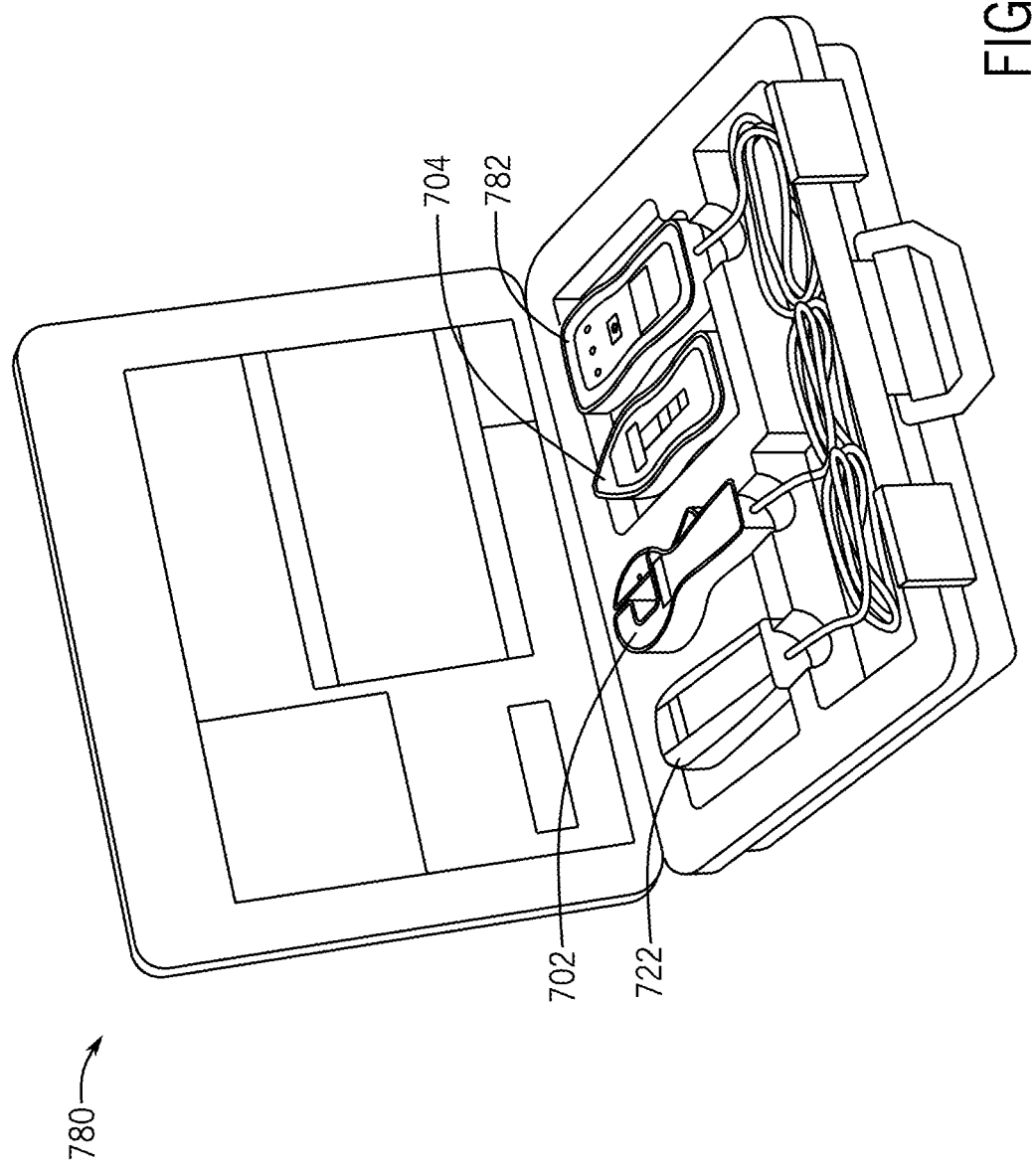

FIG. 7E depicts an illustrative circuit tracer kit 780 including numerous devices and/or components that are disclosed for use in one or more embodiments described herein. The circuit tracer transmitter 782 may be used in lieu of the inductive clamp to transmit a sequence of data signals over the conductor being tested, to the receiver device 704. Of course, the transmitter 782 might not use an induction unit because it is able to directly connect with the conductor unlike the circumstances that require an inductive clamp. Nevertheless, the operation of the data signals and data communication protocols illustrated in FIGS. 5 and 6 may be used to achieve similar functionality disclosed herein.

Figure 7F:
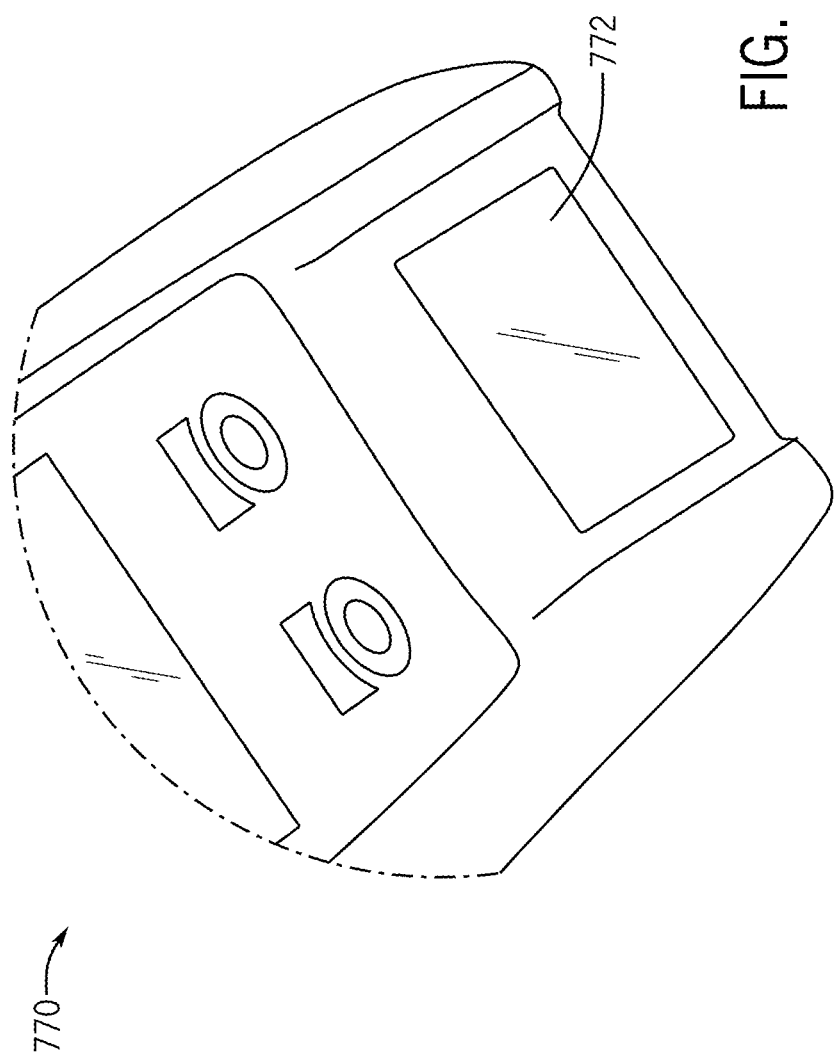

FIG. 7F illustrates that systems and methods described herein may improve the functionality of testing equipment, e.g., hand-held circuit tracer devices, inductive clamp devices, and receptacle testers, by allowing for an additional (e.g., second) display. As shown in FIG. 7F, the additional display 772 may be positioned on a face (e.g., bottom) of the housing of a hand-held device 770 in a plane approximately perpendicular to the plane of the rigid jaws extending from the housing, as elaborated upon in commonly assigned U.S. Pat. No. 6,975,104, which is herein incorporated by reference in its entirety for all purposes. The additional display may duplicate the information and/or type of information displayed on another, existing display. For example, the amperage may be displayed on a display on an inductive clamp device, on a display of the tracer transmitter device, on a display of a corresponding tracer receiver device, and/or on a mobile device wirelessly sync'd with any of the aforementioned handheld devices.

Referring to FIG. 7F, as explained in U.S. Pat. No. 6,975,104, there are several ways to incorporate multiple displays on the handheld devices described herein. At least one benefit of mounting displays on separate planes is that at least one of the displays will be readily visible regardless the of orientation of the handheld device/meter/transmitter/receiver/tester. A (backlit) display eliminates the need to bend or twist conductors or place a user's head near or in the panel, and it allows the user to easily read the bottom display when taking all measurements. Furthermore, in some embodiments, one or more display screens may be selectably covered by a pivotable flap. In another embodiment, a display screen may be pivotally mounted to the housing so it may be tilted to a suitable viewing position.

Figure 7G:
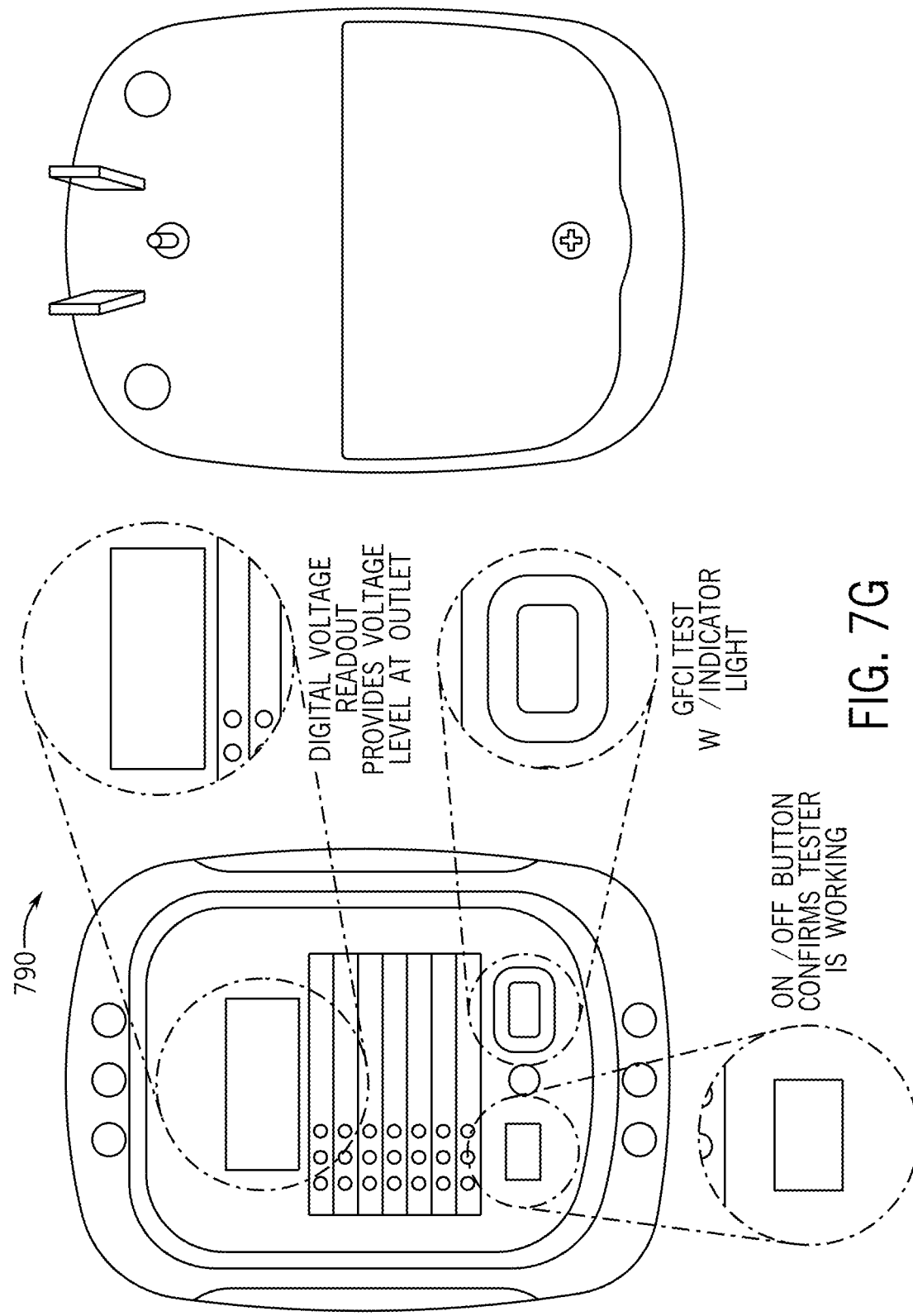

Referring to FIG. 7G, a standalone receptacle tester 790 is illustrated that performs several tests at once, but the tests themselves essentially fall into two categories: tests which determine that the outlet has power; and tests which determine that the outlet may be properly wired for safe operation. Some receptacle testers include an additional option (e.g., button) to check GFCI devices, which supplements the test button within the GFCI, and may be used to test electrical outlets downstream from a GFCI receptacle.

One or more aspects of FIG. 7G are integrated into the circuit tracer transmitter device 782 to provide a unitary device that enables electricians and users to more efficiently perform multiple tasks. For example, the illustrative kit 780 in FIG. 7E includes numerous devices and/or components, and may include a standalone receptacle tester 790. However, in some examples, an integrated circuit tracer transmitter includes the circuitry and functionality of an enhanced receptacle tester that performs one or more of the tests described herein on a receptacle, while the tracer transmitter is also performing other functions.

Figure 8A:
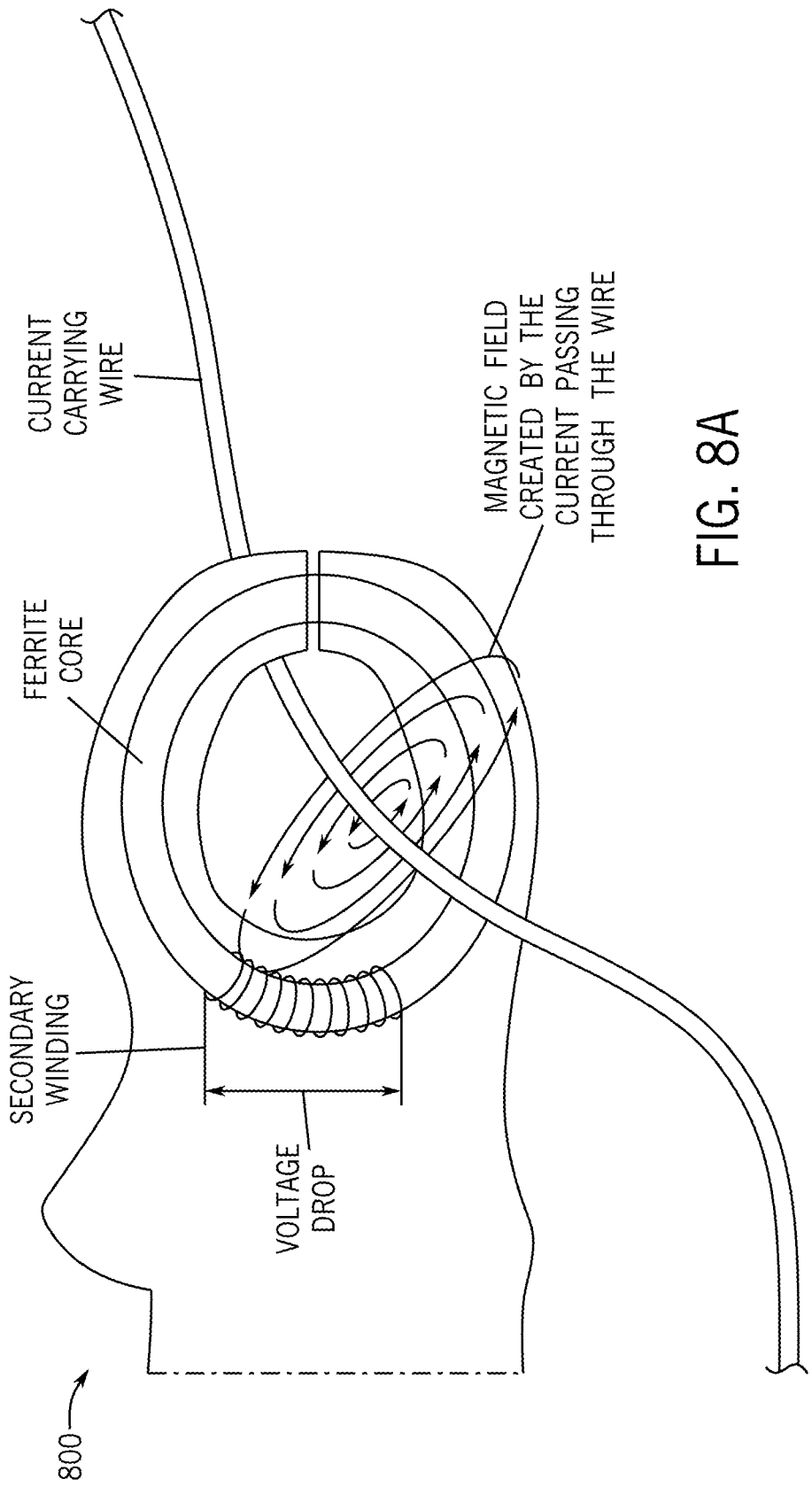
FIG. 8A, FIG. 8B, and FIG. 8C (collectively, "FIG. 8") illustrate functionality and inner workings of an inductive device (e.g., clamp, fork, and others) for use in some implementations.
Figure 8B:
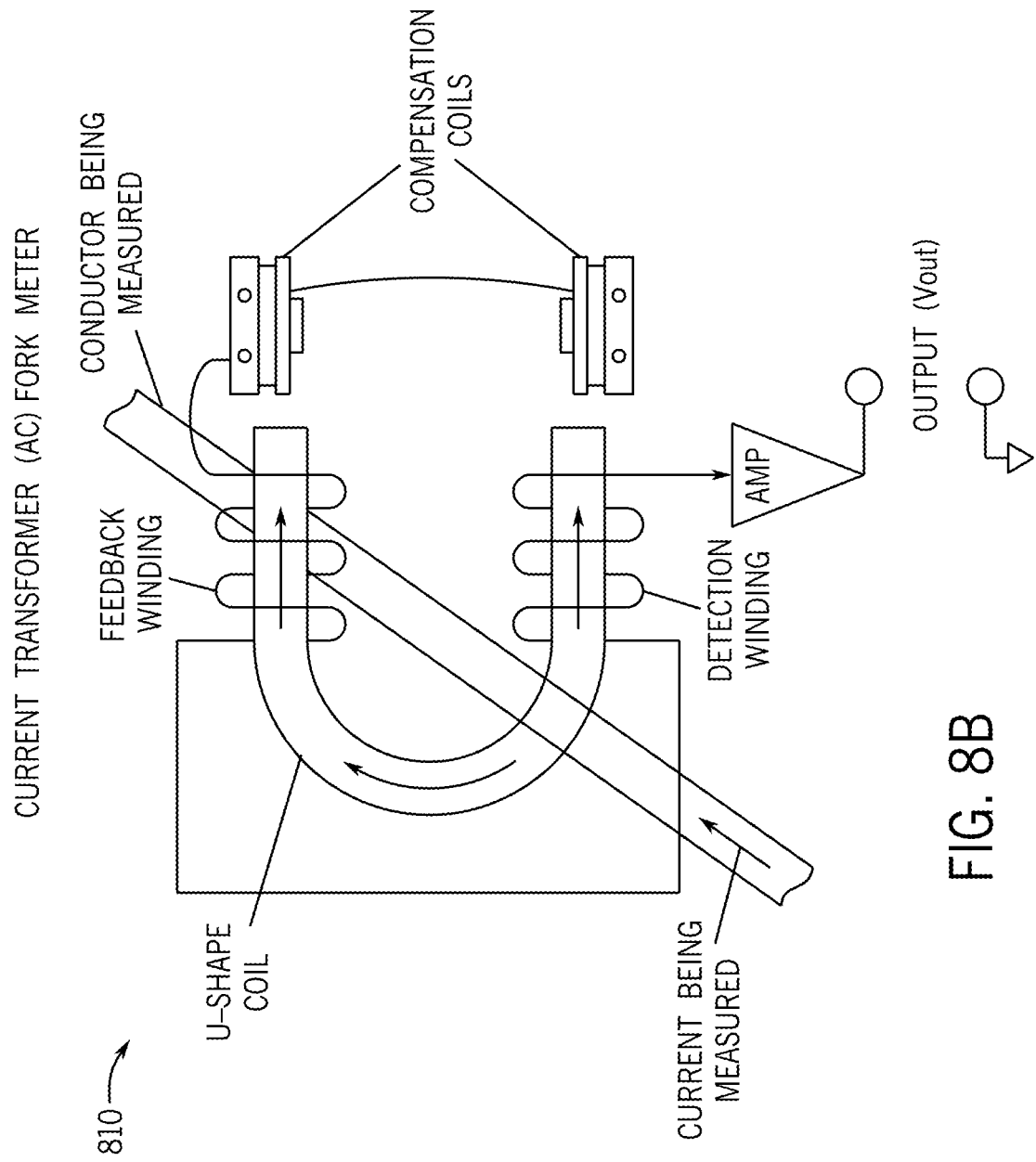
Figure 8C:
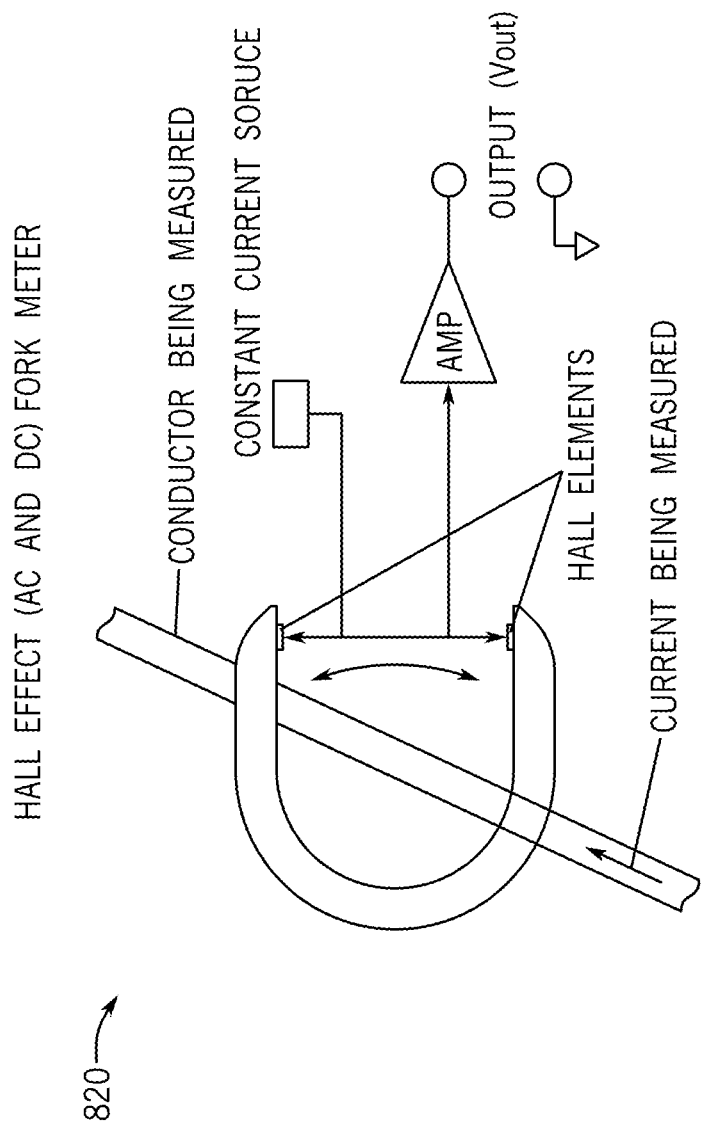

FIG. 8A illustrates a functionality and inner workings of an inductive clamp for use in some implementations. Inside the plastic moldings, the clamp/sensor/jaw of an inductive clamp meter may comprise ferrite iron and is designed to detect, concentrate, and measure the magnetic field being generated by current as it flows through a conductor. The inductive clamp includes an induction unit that comprises one or more of the elements illustrated in FIG. 8A. And the induction unit is configured to cause a discrete sequence of signals to be generated on the conductor and then transmitted through the conductor to one or more receiver devices, such as a circuit tracer receiver.

Figure 9B:
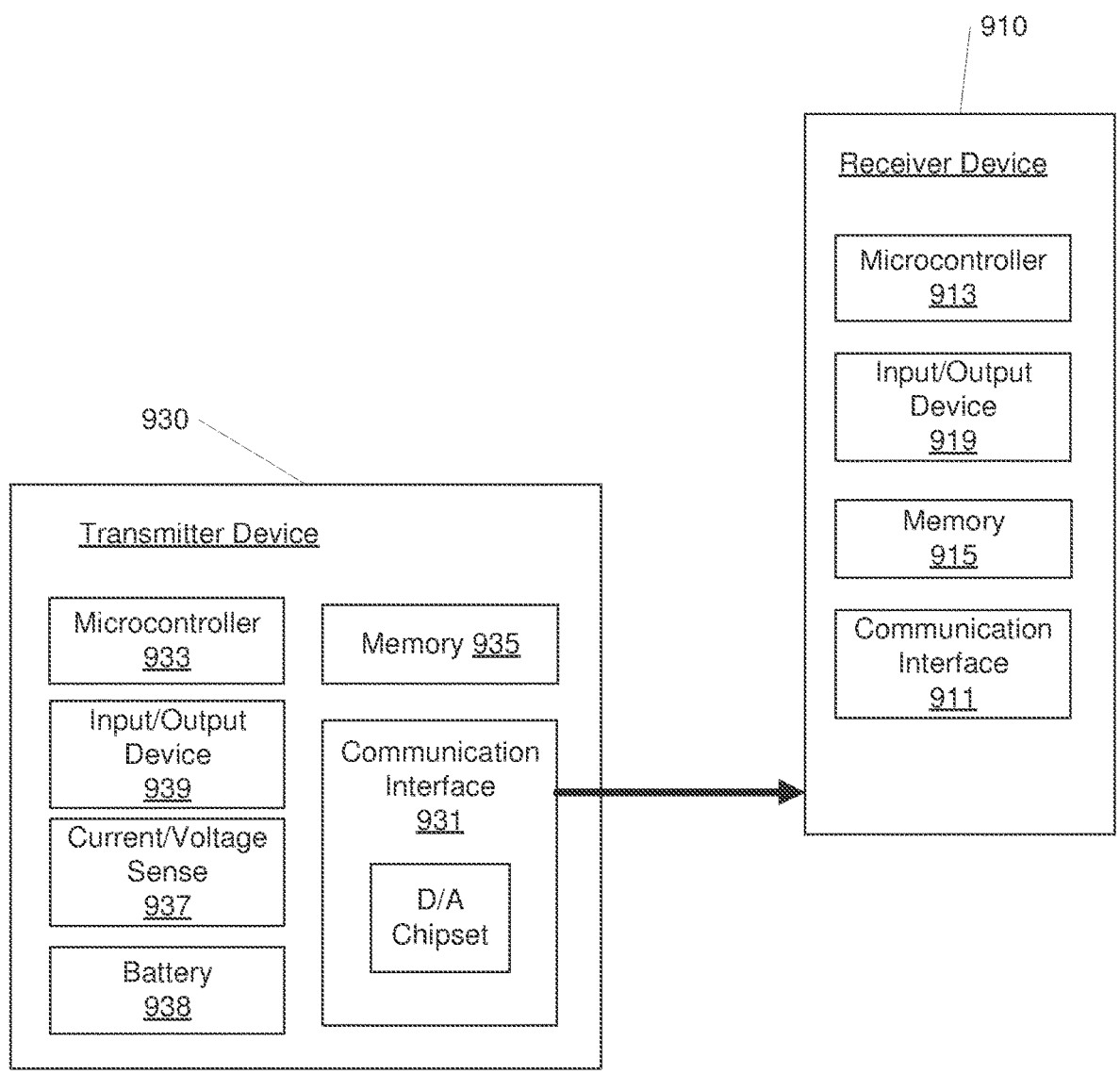
Figure 9C:
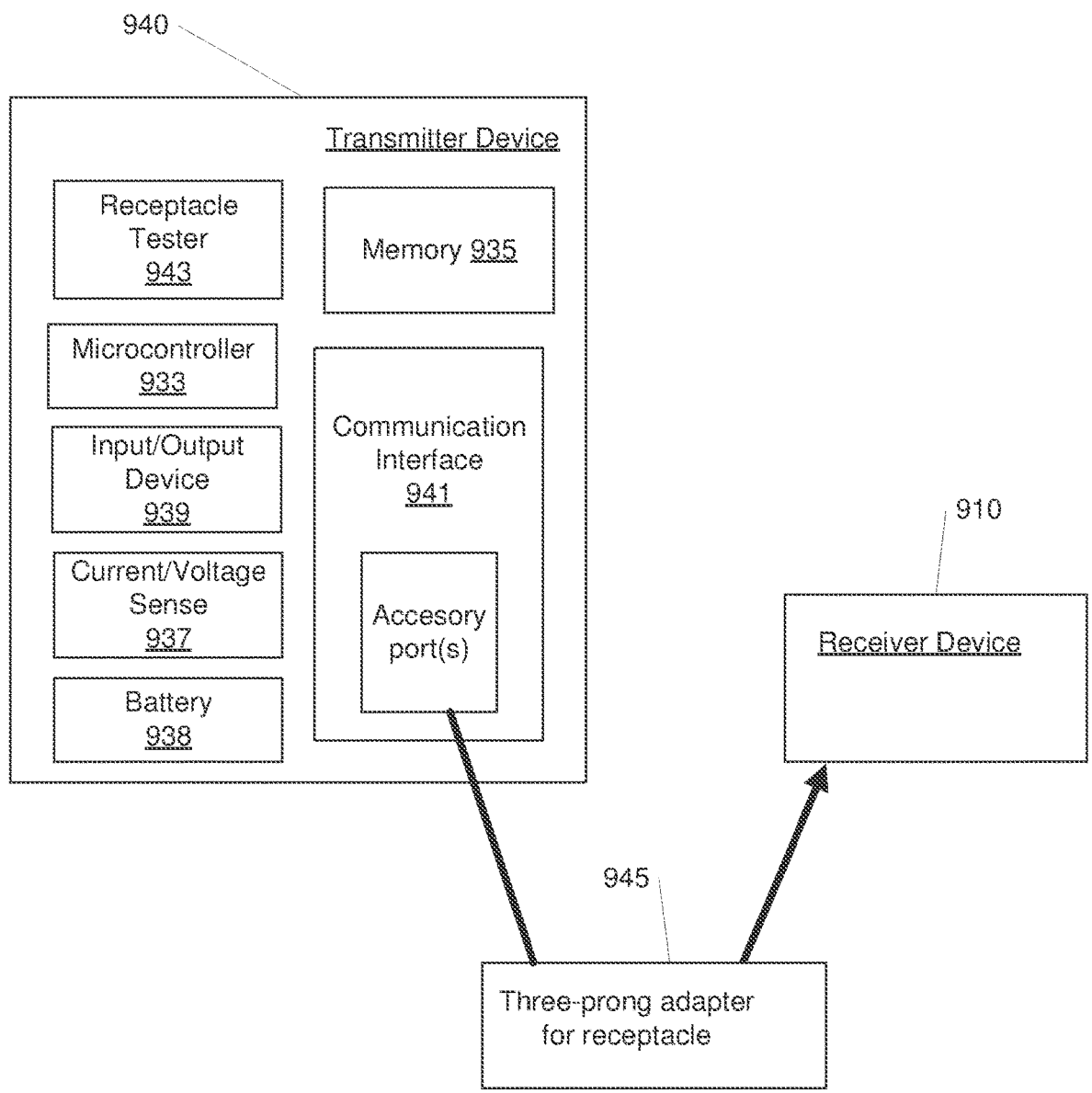

FIG. 9A, FIG. 9B, and FIG. 9C (collectively "FIG. 9") depict a diagram of one or more devices of a circuit tracer kit in use. In the illustrated example, an inductive clamp 920 is equipped to communicate data, over a conductor (indicated by the bolded arrow in FIG. 9A) that is being tested, to a circuit tracer receiver 910. The inductive clamp (the inner working of which are illustrated in FIG. 8) is equipped with an induction unit that induces a sequence of data signals (in a tracing signal) onto the conductor. Conversely, as illustrated in FIG. 7D by the various measurements visible around the dial/rotary switch, an induction unit may be used to measure flowing current (or read other measurements) in the conductor. Meanwhile, the circuit tracer receiver 910 equipped with a communication interface to receive the sequence of data signals on the conductor and process the sequence by a microcontroller (or other circuitry) in the circuit tracer receiver.

Although an inductive clamp device 920 is depicted in FIG. 9A as comprising a battery 928, in some embodiments, no battery may be included and instead an external battery 722 may be coupled to the inductive clamp 702 as illustrated in FIG. 7B. The coupling may occur using a wire as illustrated in FIG. 7C. Moreover, although an inductive clamp 920 is illustrated in FIG. 9A, that device may be substituted with another device comprising an induction unit, such as a fork meter, or other comparable devices.

Regarding FIG. 9B, the communication interface 931 may include, in some examples, a digital to analog chipset to convert the desired binary "0" or binary "1" output of the microcontroller 933 onto the conductor being tested given that an induction unit might not be present on a particular circuit tracer transmitter device 930. In lieu of the inductive clamp to transmit a sequence of data signals over the conductor being tested, the circuit tracer transmitter 782 may be use other methods to transmit over the conductor to the receiver device 910. Nevertheless, the operation of the data signals and data communication protocols illustrated in FIGS. 5 and 6 may be used to achieve similar functionality disclosed herein.

Regarding FIG. 9C, a circuit transmitter device 940 may include a communication interface 941, in some examples, that has one or more ports to which an accessory clip/probe/adapter may be connected. The circuit transmitter device 940 may use an adapter 945 with a three-prong plug, for example, to test an electrical receptacle/outlet (e.g., a 3-wire receptacle) on a wall. In other examples, the adapter 945 may comprise an Isolated Ground Adapter that verifies that a receptacle is isolated from system Ground and bonded to other devices on a branch circuit. The Isolated Ground Adapter creates a parallel pathway to ground, which results in a lower ground impedance reading with the adapter versus with the receptacle with the isolated ground; if the two readings are the same, then the receptacle does not have an isolated ground, but if the reading taken with the isolated ground adapter is lower, then the receptacle has an isolated ground. In another example, the adapter 947 may comprise a Ground Continuity Adapter that verifies cabinet and/or equipment chassis have been properly bonded to system Ground. The circuit transmitter device 940 may include circuitry for a receptacle tester 943, as described herein. In another embodiment, the receptacle tester 943 may be implemented as computer-readable instructions stored in memory 935 and executed by a microcontroller 933.

While FIG. 9C has been illustrated with a transmitter device 940 having accessory ports, the disclosure also contemplates that an inductive claim device 920 as illustrated in FIG. 9A may include accessory ports and provide the same functionality as the transmitter device 940. Likewise, the transmitter device 940 in FIG. 9C may include an additional display 772 as illustrated in FIG. 7F, a continuity load tester circuit 300A as illustrated in FIG. 3, and/or advanced communication capabilities as illustrated in FIG. 5. In addition, although several embodiments are described with respect to a three-prong plug (or three-wire receptacle), the disclosure is not so limited; rather, the disclosure contemplates a multi-prong plug that accommodates varying global standards including four-prong plugs and two-prong plugs, as well as varying voltage levels and other adjustments.

Figure 10:
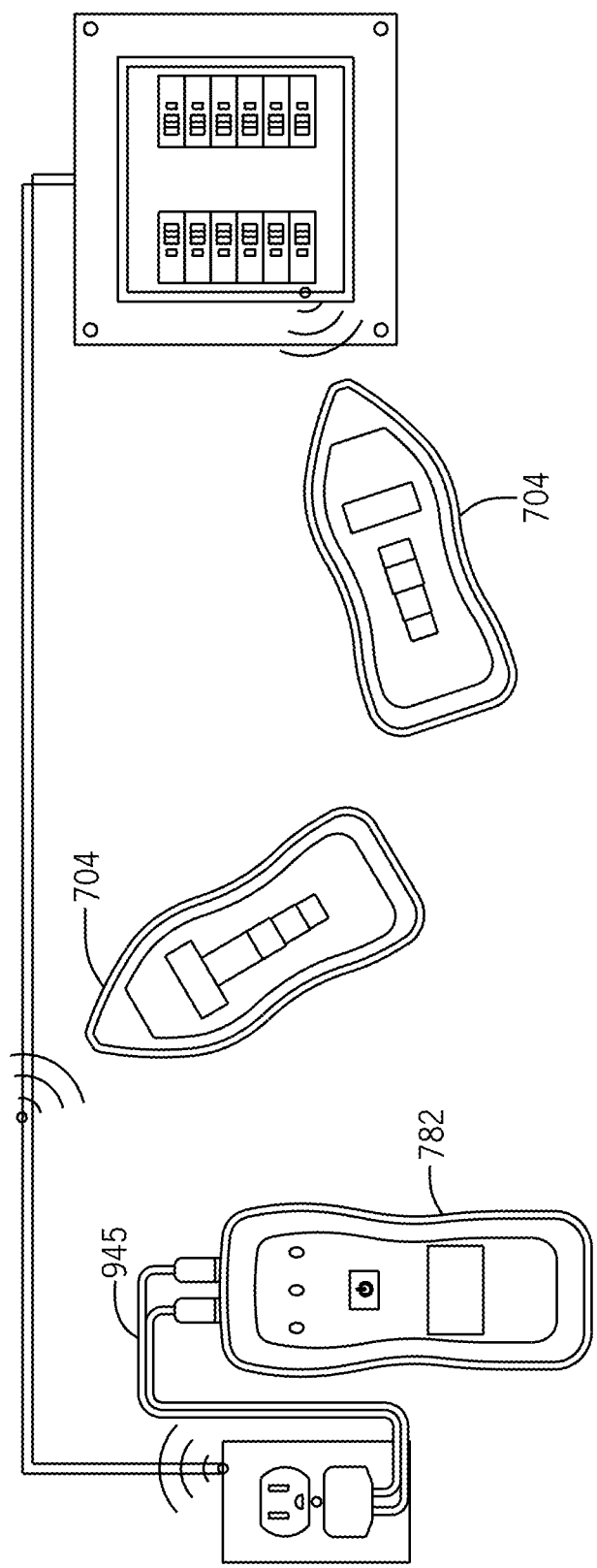
FIG. 10 shows an illustrative accessory adapter an integrated receptacle tester, in accordance with some implementations described herein.

Referring to FIG. 10, an example of an illustrative accessory adapter 945 is depicted. The circuit tracer transmitter 782 comprises circuitry and/or logic for an integrated receptacle tester 943. In one example, the transmitter 782 transmits a signal which is placed on the conductor with adapter 945, alligator clips, or an inductive clamp. One or more receiver devices 704 tuned to the same signal sense the signal and determine its strength to locate the breaker, conductor, or fault. For purposes of an integrated receptacle tester, the screen display on the transmitter device 782 may include a display with HGN or similar indicators (as shown in FIG. 12). The system may also add ground sensing to receiver and cord. As explained with respect to FIG. 7G, at least one benefit of an integrated receptacle tester resulting in a unitary device is that it enables electricians and users to more efficiently perform multiple tasks. For example, an integrated circuit tracer transmitter 782 including the circuitry and functionality of an enhanced receptacle tester can performs one or more of the tests, as explained below, on a receptacle, while the tracer transmitter is also performing other functions.

Figure 11A:
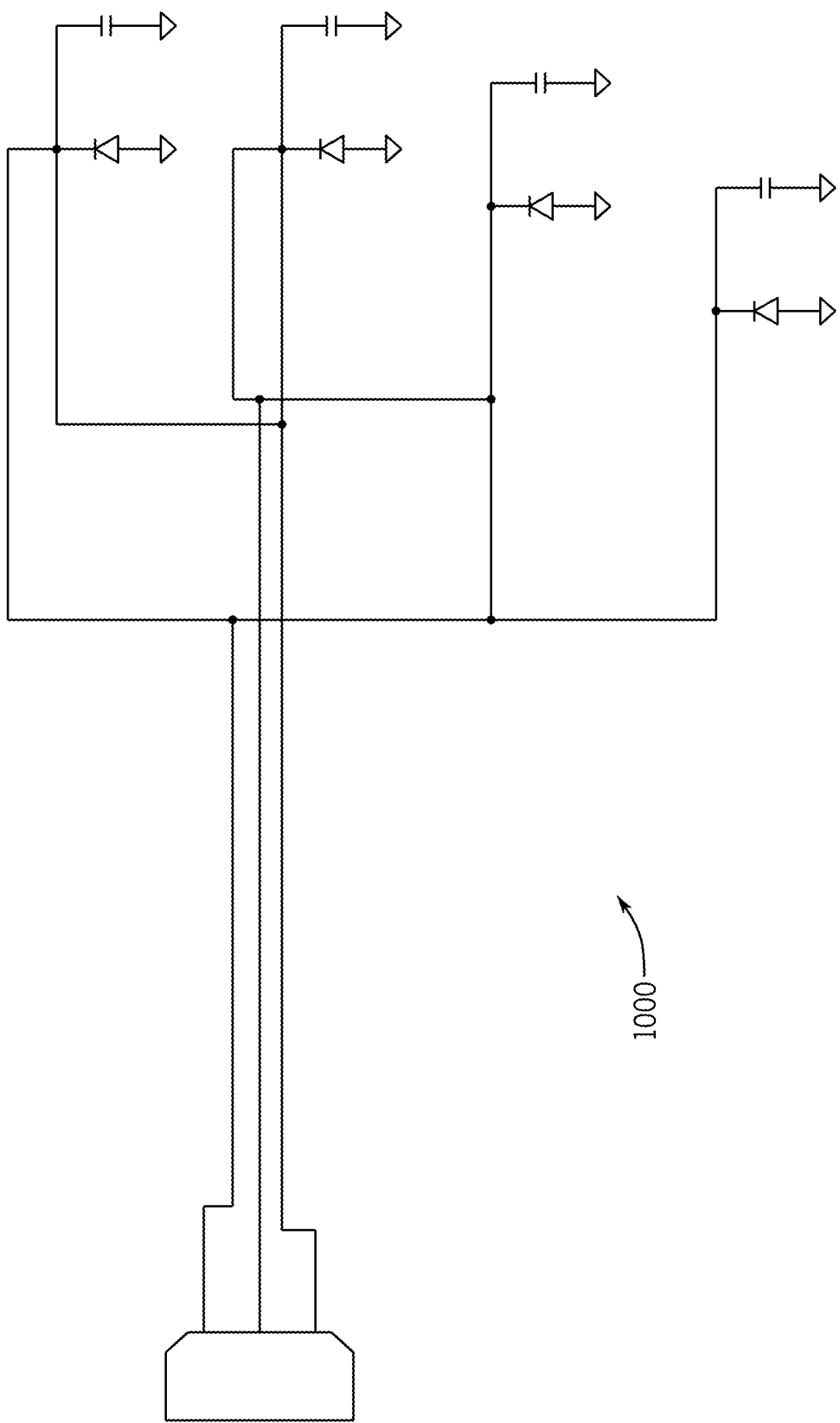
FIG. 11A, FIG. 11B, and FIG. 11C (collectively, "FIG. 11") illustrate aspects of circuits in a tracer transmitter device that integrates the ability to test electrical receptacle wiring, in accordance with some implementations described herein.
Figure 11B:
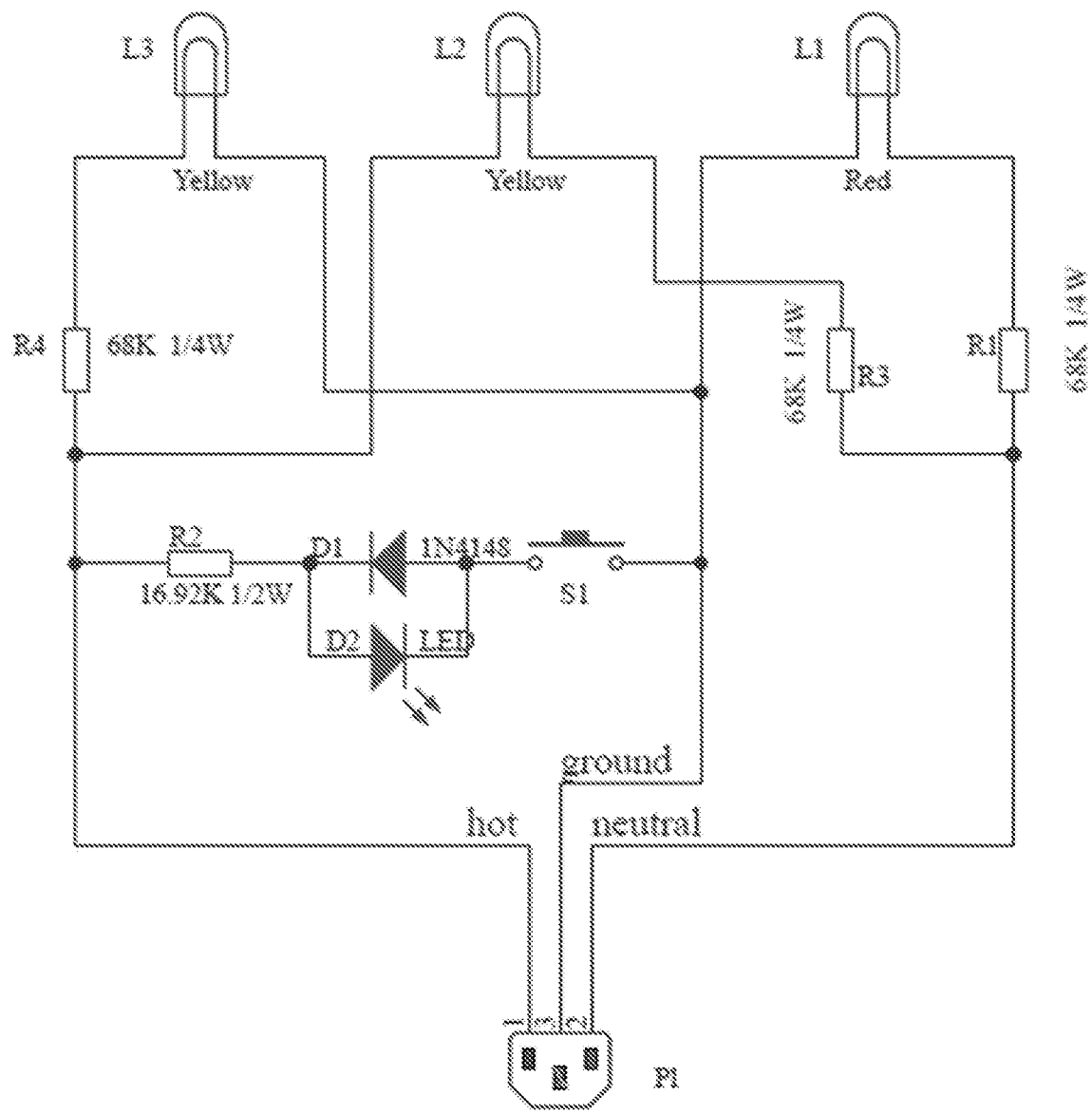
Figure 11C:
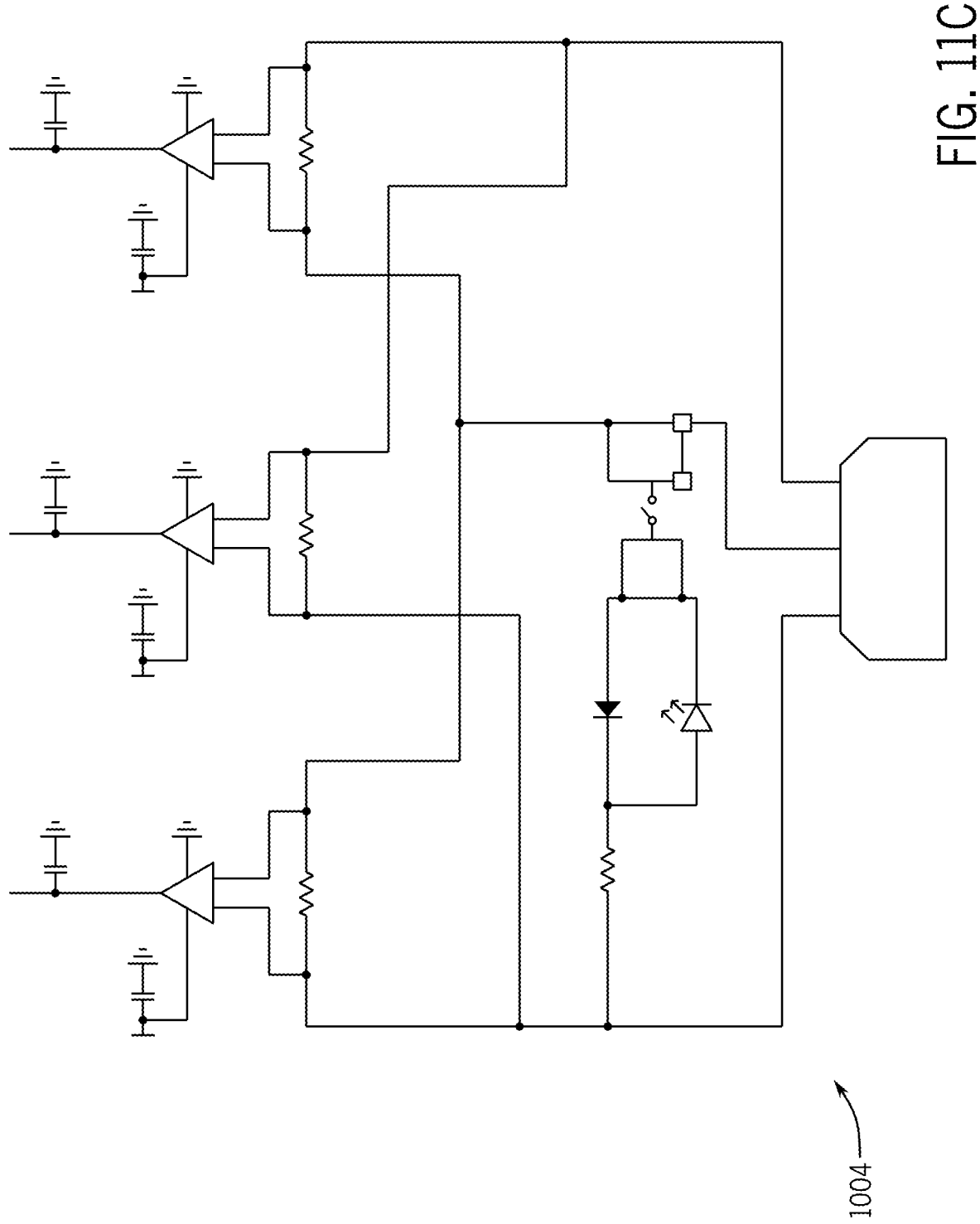

Regarding to FIG. 11, illustrative aspects of circuits in a circuit tracer transmitter are disclosed that integrates the ability to test electrical receptacle wiring. The integrated receptacle testers are able to test and visually indicate one or more of the following receptacle wiring configurations depicted in FIG. 11A, FIG. 11B, and/or FIG. 11C in a single, integrated circuit tracer transmitter: (Test #1) Wired correctly; (Test #2) Open Ground (e.g., when resistance exceeds 3.0 Ohms, in some examples); (Test #3) Reverse Polarity (HOT and NEUTRAL are swapped); (Test #4) Open HOT; (Test #5) Open NEUTRAL; (Test #6) HOT and GROUND Reversed; (Test #7) HOT on NEUTRAL with HOT open, and (Test #8) open GFCI test. One or more tests may also be performed by the integrated receptacle tester, such as testing to determine a false or bootleg ground, which is an unintentional bond between the neutral and ground conductors anywhere in the branch circuit other than in the panel.

Referring to FIG. 11A, an illustrative example of aspects of a sense circuit 1000 that is able to perform test numbers 1, 2, 3 and 4 is depicted. The outputs of these circuits may be inputs to an analog-to-digital (A2D) converter, which is either integrated in a microcontroller and/or stand-alone. Similarly equivalent circuits may be implemented to perform test numbers 5-7. The screen display 939 of the handheld device 940 may display the assessment of the receptacle test.

Additionally, illustrated in FIG. 11A is a ZERO-CROSS detection sensing circuit. This may be used by a microcontroller 933 in the circuit tracer transmitter to measure a frequency of the line voltage. This frequency may then be displayed along with the line voltage as well as receptacle wiring information.

Some examples of software-implemented logic/steps (e.g., computer-executable instructions stored on a non-transitory tangible medium) to detect failures are listed below. Additional software/firmware may be added in conjunction with additional sensing circuits to detect more failures or other states. Referring to FIG. 11A, in a step 1, the circuit may measure VPN. In step 2, the circuit determines that if VPN is less than a threshold, then the HOT line is not connected. In step 3, the circuit determines that if VPN is greater than threshold, then NEUTRAL AND EARTH could be open. In step 4, if VENLR is approximately zero, then only NEUTRAL OPEN. Moreover, continuing to refer to FIG. 11A, in step 5, the circuit may measure voltage at A2D_VENLR. In step 6, the circuit determines if A2D_VENLR voltage is above a threshold, then GROUND is either open or polarity is reversed. In step 7, if A2D_VENHR is below a threshold, then GROUND is open. In step 8, if A2D_VENHR is above the threshold in step 3, then polarity is reversed. And, in step 9, if A2D_VENLR is below the threshold in step 2, then the receptacle is connected/wired properly. As a result of the steps performed, the tracer transmitter device displays wiring conditions 1202, in some embodiments, in a manner shown in FIG. 12A, which shows a HOT, GROUND, and NEUTRAL indicator with an ON, OFF, or flashing indication.

Figures 12A, 12B:
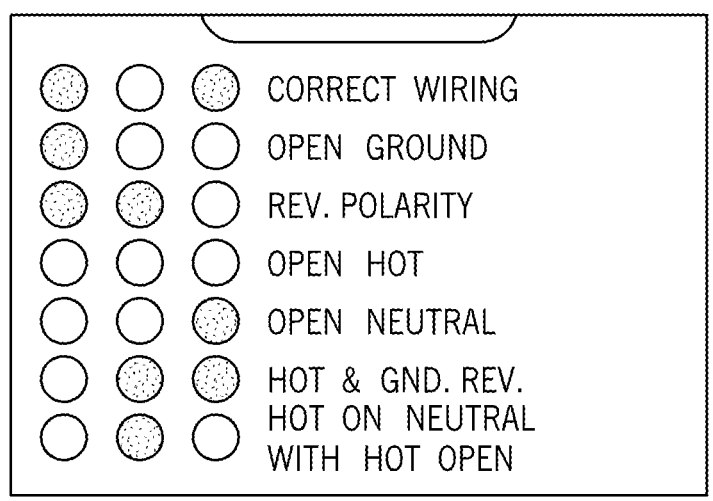
FIG. 12A and FIG. 12B (collectively, "FIG. 12") illustrate visual indicators on an integrated circuit tracer transmitter with receptacle testing capabilities.

In an alternate embodiment, a circuit 1002 shown in FIG. 11B may be used in conjunction with visual indicators to indicate wiring errors. The visual indications 1204 may be presented as shown in FIG. 12B, which uses colored lights/LEDs to indicate between different potential scenarios determined by the integrated receptacle tester. This circuit also provides for GFCI testing by depressing S1 to engage the load to ground.

Referring to FIG. 11C, in yet another alternate embodiment, a current sensing circuit 1004 may be used in place of the visual indicators (L1, L2 and L3) depicted in FIG. 11B; an illustrative configuration is shown in FIG. 11C. The current sensed is provided to a microcontroller analog-to-digital (A2D) convertor. The current detected through each of the three current sensors is used to determine the wiring status and then displayed on the circuit tracers transmitter's display (e.g., OLED or other display).

Regarding to FIG. 12, illustrative visual indicators on an integrated circuit tracer transmitter with receptacle testing capabilities are shown. The visual indicators may be LED lights or other types of lights, or might be a screen display configured to allow for the display of images, icons, and/or characters. In some examples (including those in FIG. 11), the screen display may output human-readable information that does not necessarily require providing the user with a legend—for example, the text (or some variation of that text) may be displayed on the display screen in lieu of binary or tertiary light indicators. For example, a user of the device 940 may read "Correct Wiring" or "Rev Polarity" on the screen display. Moreover, in some examples, the input/output device 939 of the device 940 may output an audible indicator in lieu or, or in addition to, the visual indicators. The audible indicator may be through a speaker that outputs a voice message through configuration of the microcontroller block. The screen display may be on the tracer transmitter 940 or may be communicatively coupled, as described herein (e.g., FIG. 1B), to the tracer transmitter 782.

Although the present invention has been described in certain specific aspects, many additional modifications and variations would be apparent to those skilled in the art. In particular, any of the various processes described above may be performed in alternative sequences and/or in parallel (on different computing devices) to achieve similar results in a manner that is more appropriate to the requirements of a specific application. It is, therefore, to be understood that the present invention may be practiced otherwise than specifically described without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

Some illustrative embodiments are disclosed herein, including but not limited to:

Embodiment 1

A circuit tracer transmitter with integrated continuity testing for locating electrical wiring faults, comprising:
 a line coupling transformer;
 a current sense circuit;
 a microcontroller;
 an output driver configured to drive the line coupling transformer;
 an indicator;
 wherein the current sense circuit is configured to sense a current on a primary driver side of the line coupling transformer and input data indicative of the current;
 wherein the microcontroller is configured to conduct a continuity test by automatically comparing the input data to a threshold level of current and generating an alert using the indicator if the threshold level of current is met or exceeded unless inhibited; and
 wherein the alert indicates continuity on test leads on a secondary driver side of the line coupling transformer.

The embodiment of embodiment 1, further comprising:
 a voltage detection circuit on the secondary driver side of the line coupling transformer;
 wherein the continuity test is inhibited if a live circuit is detected by the voltage detection circuit.

The embodiment of embodiment 1, wherein the current sense circuit is configured to measure a current draw input to the output driver.

The embodiment of embodiment 1, wherein the current sense circuit is configured to measure a current draw output from the output driver.

The embodiment of embodiment 1, wherein the current sense circuit comprises an analog to digital converter and sends a digital value as the input data indicative of the current.

The embodiment of embodiment 1, wherein the indicator is one of a visual display, an audible output, or combination thereof.

The embodiment of embodiment 1, wherein the circuit tracer transmitter (or other hand-held testing device) includes an additional screen display on a plane perpendicular to the existing visual display, wherein the perpendicular plane is on the bottom-end of the transmitter/testing device.

The embodiment of embodiment 1, further comprising a display, wherein the indicator is a visual alert displayed on the display, and wherein the display is configured to allow for the display of images, icons, and/or characters.

The embodiment of embodiment 1, wherein the indicator is an LED light, wherein illumination of the LED light indicates continuity on the test leads.

The embodiment of embodiment 1, wherein the indicator is a buzzer, wherein sound emitted from the buzzer indicates continuity on the test leads.

The embodiment of embodiment 1, further comprising:
a voltage detection circuit on the secondary driver side of the line coupling transformer;
wherein a continuity test is inhibited if a live circuit is detected by the voltage detection circuit, wherein detection of a live circuit causes an alert.

The embodiment of embodiment 1, further comprising:
a voltage detection circuit on the secondary driver side of the line coupling transformer;
wherein a continuity test is inhibited if a live circuit is detected by the voltage detection circuit, wherein detection of a live circuit causes an alert comprising one of a displayed image, icon, or character, an illuminated LED or audio alert.

Embodiment 2

A circuit tracer transmitter with integrated continuity testing for locating electrical wiring faults, comprising:
a line coupling transformer;
a current sense circuit;
a microcontroller;
an output driver configured to drive the line coupling transformer;
a wireless module configured to communicate an alert wirelessly to a display;
wherein the current sense circuit is configured to sense a current on a primary driver side of the line coupling transformer and input data indicative of the current;
wherein the microcontroller is configured to conduct a continuity test by automatically comparing the input data to a threshold level of current and generating the alert if the threshold level of current is met or exceeded unless inhibited; and
wherein the alert indicates continuity on test leads on a secondary driver side of the line coupling transformer.

The embodiment of embodiment 2, further comprising:
a voltage detection circuit on the secondary driver side of the line coupling transformer;
wherein the continuity test is inhibited if a live circuit is detected by the voltage detection circuit.

The embodiment of embodiment 2, wherein the current sense circuit is configured to measure a current draw input to the output driver.

The embodiment of embodiment 2, wherein the current sense circuit is configured to measure a current draw output from the output driver.

The embodiment of embodiment 2, wherein the current sense circuit comprises an analog to digital converter and sends a digital value as the input data indicative of the current.

The embodiment of embodiment 2, further comprising the display, wherein the display is configured to communicate wirelessly to the wireless module via Bluetooth.

The embodiment of embodiment 2, further comprising the display, wherein the display is configured to communicate wirelessly to the wireless module via Wi-Fi.

The embodiment of embodiment 2, further comprising the display, wherein the display is configured to communicate wirelessly to the wireless module, wherein the display is configured to allow for the display of images, icons, and/or characters as the alert.

The embodiment of embodiment 2, further comprising:
a voltage detection circuit on the secondary driver side of the line coupling transformer;
wherein a continuity test is inhibited if a live circuit is detected by the voltage detection circuit, wherein detection of a live circuit causes the alert.

The embodiment of embodiment 2, further comprising:
a voltage detection circuit on the secondary driver side of the line coupling transformer;
wherein a continuity test is inhibited if a live circuit is detected by the voltage detection circuit, wherein detection of a live circuit causes the alert comprising one of a displayed image, icon, or character, an illuminated LED or audio alert.

Embodiment 3

A method of performing a continuity test using the circuit tracer transmitter of embodiment 1, the method comprising
sensing, using a current sense circuit, a current on a primary driver side of a transformer;
receiving, by a microcontroller, input data indicative of the current;
comparing, by the microcontroller, the input data to a threshold level of current;
generating, by the microcontroller and using an indicator, an alert if the threshold level of current is met or exceeded;
wherein the alert indicates continuity on test leads on a secondary driver side of the transformer.

The embodiment of embodiment 3, wherein the transformer is a line coupling transformer.

The embodiment of embodiment 3, wherein the transformer is a line coupling transformer, and wherein sensing by the current sense circuit is done at an input to an output driver driving the line coupling transformer.

The embodiment of embodiment 3, wherein the transformer is a line coupling transformer, and wherein sensing by the current sense circuit is done at an output of an output driver driving the line coupling transformer.

The embodiment of embodiment 3, wherein the current sense circuit comprises an analog to digital converter and sends a digital value as the input data indicative of the current.

The embodiment of embodiment 3, wherein the indicator is one of a visual display, an audible output, or combination thereof.

The embodiment of embodiment 3, wherein the indicator is a visual alert displayed on a display, wherein the display allows for the display of images, icons, and/or characters, and wherein the visual alert displayed on the display indicates continuity on the test leads.

The embodiment of embodiment 3, wherein the indicator is an LED light, wherein illumination of the LED light indicates continuity on the test leads.

The embodiment of embodiment 3, wherein the indicator is a buzzer, wherein sound emitted from the buzzer indicates continuity on the test leads.

The embodiment of embodiment 3, wherein the transformer is a line coupling transformer, and further comprising inhibiting, by a microcontroller, a continuity test if a live circuit is detected by a voltage detection circuit on a secondary driver side of the line coupling transformer.

The embodiment of embodiment 3, wherein the transformer is a line coupling transformer, and further comprising inhibiting, by the microcontroller, a continuity test if a live circuit is detected by a voltage detection circuit on a secondary driver side of the line coupling transformer and generating, by the microcontroller, an alert consequent to detecting the live circuit.

The embodiment of embodiment 3, wherein the transformer is a line coupling transformer, and further comprising inhibiting, by the microcontroller, a continuity test if a live circuit is detected by a voltage detection circuit on a secondary driver side of the line coupling transformer and generating, by the microcontroller, an alert consequent to detecting the live circuit comprising one of a displayed image, icon, or character, an illuminated LED, or audio alert.

Embodiment 4

A method of performing a continuity test using the circuit tracer transmitter of embodiment 1, the method comprising
sensing, using a current sense circuit, a current on a primary driver side of a transformer;
receiving, by a microcontroller, input data indicative of the current;
comparing, by the microcontroller, the input data to a threshold level of current;
generating, by the microcontroller, an alert if the threshold level of current is met or exceeded;
sending, by the microcontroller, the alert to a wireless module configured to send the alert to a display;
wherein the alert indicates continuity on test leads on a secondary driver side of the transformer.

The embodiment of embodiment 4, wherein the transformer is a line coupling transformer.

The embodiment of embodiment 4, wherein the transformer is a line coupling transformer, and wherein sensing by the current sense circuit is done at an input to an output driver driving the line coupling transformer.

The embodiment of embodiment 4, wherein the transformer is a line coupling transformer, and wherein sensing by the current sense circuit is done at an output of an output driver driving the line coupling transformer.

The embodiment of embodiment 4, wherein the current sense circuit comprises an analog to digital converter and sends a digital value as the input data indicative of the current.

The embodiment of embodiment 4, wherein the display allows for the display of images, icons, and/or characters, and wherein the visual alert displayed on the display indicates continuity on the test leads The embodiment of embodiment 4, wherein the transformer is a line coupling transformer, and further comprising inhibiting, by a microcontroller, a continuity test if a live circuit is detected by a voltage detection circuit on a secondary driver side of the line coupling transformer.

The embodiment of embodiment 4, wherein the transformer is a line coupling transformer, and further comprising inhibiting, by the microcontroller, a continuity test if a live circuit is detected by a voltage detection circuit on a secondary driver side of the line coupling transformer and generating, by the microcontroller, an alert consequent to detecting the live circuit.

The embodiment of embodiment 4, wherein the transformer is a line coupling transformer, and further comprising inhibiting, by the microcontroller, a continuity test if a live circuit is detected by a voltage detection circuit on a secondary driver side of the line coupling transformer and generating, by the microcontroller, an alert consequent to detecting the live circuit, wherein the alert is sent to the display using the wireless module and comprises one of a displayed image, icon, or character.

Embodiment 5

A circuit tracer transmitter for locating electrical wiring faults, comprising:
an inductive clamp;
tracing circuitry configured to drive a tracing signal into the inductive clamp;
wherein the same inductive clamp is used to measure current flowing in a conductor.

Embodiment 6

The embodiment of embodiment 5 further comprising:
current transformer function circuitry configured to detect a magnetic field as current flows through a conductor and convert the detection into an amperage value;
a display configured to display the amperage value.

The embodiment of embodiment 6, wherein the current transformer function circuitry is integrated as part of the inductive clamp.

The embodiment of embodiment 6, wherein the display and the current transformer function circuitry is integrated as part of the inductive clamp.

Embodiment 7

A circuit tracer device with integrated continuity testing for locating electrical wiring faults, comprising:

a conventional circuit tracer receiver;
a circuit tracer transmitter distinct and apart/separate from the circuit tracer receiver, wherein the circuit tracer transmitter at least comprises:
a line coupling transformer having a primary driver side and a secondary driver side;
a current sense circuit;
a microcontroller or equivalent thereof;
an output driver configured to drive the line coupling transformer; and
a voltage detection circuit on the secondary driver side of the line coupling transformer;
wherein the current sense circuit is configured to sense a current on a primary driver side of the line coupling transformer and input data indicative of the current;
wherein the voltage detection circuit configured to detect if the circuit tracer transmitter is live and inhibit the continuity test.
wherein a circuit component is configured to trigger execution of a continuity test by automatically comparing the input data to a threshold level of current and generating an alert using the indicator if the threshold level of current is satisfied (e.g., met or exceeded) absent the continuity test having been inhibited;
wherein the alert indicates continuity on test leads on a secondary driver side of the line coupling transformer; and
wherein the continuity test is inhibited if a live (e.g., energized) circuit is detected by the voltage detection circuit.
The embodiment of embodiment 7 including one or more of the preceding sub-embodiments of embodiment 1.

Embodiment 8

A circuit tracer transmitter with integrated continuity testing for locating electrical wiring faults, comprising:
a line coupling transformer;
a current sense circuit;
a microcontroller;
an output driver configured to drive the line coupling transformer;
an indicator;
a voltage detection circuit on the secondary driver side of the line coupling transformer;
wherein the current sense circuit is configured to sense a current on a primary driver side of the line coupling transformer and input data indicative of the current;
wherein the microcontroller is configured to conduct a continuity test by automatically comparing the input data to a threshold level of current and generating an alert using the indicator if the threshold level of current is met or exceeded unless inhibited;
wherein the alert indicates continuity on test leads on a secondary driver side of the line coupling transformer; and
wherein the continuity test is inhibited if a live circuit is detected by the voltage detection circuit.
The embodiment of embodiment 8 including one or more of the preceding sub-embodiments of embodiment 1.

Embodiment 9

A circuit tracer kit including at least a circuit tracer receiver and an inductive clamp that can communicate data over a conductor that is being tested, comprising:
the inductive clamp (as illustrated in FIG. 8) equipped with an induction unit;
the induction unit comprising circuitry configured to induce a sequence of data signals (in a tracing signal) onto the conductor;
wherein the same induction unit is equipped with circuitry configured to measure (or sense) current flowing in the conductor;
the circuit tracer receiver equipped with a communication interface to receive the sequence of data signals on the conductor and process the sequence by a microcontroller (or other circuitry) in the circuit tracer receiver.
The embodiment of embodiment 9, wherein the induction unit comprises: a first electronics to drive a current that induces the sequence of data signals onto the conductor; and a second electronics to sense the current flowing in the conductor.
In some embodiments, the first and second electronics run concurrently to perform current measurement and induce the tracing signal at the same time.
In alternate embodiments, the first and second electronics alternate operation by performing current measurement and then inducing the tracing signal with the data previously measured.
The embodiment of embodiment 9, wherein the inductive clamp is replaced with an inductive device that does not fully encircle a conductor being tested, but instead partially encloses the conductor, such as in a U-shaped (or other shaped) fork meter.
The embodiment of embodiment 9, wherein the tracing signal from the inductive clamp to the circuit tracer receiver indicates whether the condguctor is energized or de-energized by the induction unit changing a duration of a pulse of the tracing signal from a first duration (e.g., 10 msec pulse duration indicating energized) to a second duration (e.g., 20 msec pulse duration indicating de-energized).
In some embodiments, a third, fourth, and so on different pulse widths/durations may be used to indicate numeric digits from 0-9.
In some embodiments, a third, fourth, fifth, sixth, and so on different pulse widths/durations may be used for each pulse width to indicate an ASCII character or other mapping (based on a custom mapping table stored in memory).
The embodiment of embodiment 9, wherein the tracing signal from the inductive clamp to the circuit tracer receiver indicates a binary 0 by the induction unit transmitting a pulse of the tracing signal with a first duration (e.g., 10 msec pulse duration) or indicates a binary 1 by the induction unit transmitting a pulse of the tracing signal with a second duration (e.g., 20 msec pulse duration).
In some embodiments, the induction unit may send data (e.g., numeric values) in a streamlined method using binary numbers. At least one benefit of such a method is that it may require fewer pulses to indicate the current amperage reading (or any other measurements or data communicated over the conductor line being tested).
In some embodiments, a stream of pulses may be communicated over the conductor such that a combination/series of consecutive pulses provides a 4-digit binary number which can indicate a base 10 number of 0-15.

A framing start pulse (of a sequence of pulses) of yet a different (third predetermined width) duration may be used to indicate the beginning of a current reading pulse. Similarly, a frame end pulse of similar duration as the framing start pulse could be used to indicate end of message. The framing start and end pulse may be used to enable communication of data messages of differing bit lengths.

The embodiment of embodiment 9, wherein a memory of the circuit tracer receiver stores a mapping table (as illustrated in FIG. 6) for use with the processing of the sequence of data signals.

The embodiment of embodiment 9, wherein the processing, by the circuit tracer receiver, of the sequence of data signals is performed without requiring a handshake with the induction unit.

The embodiment of embodiment 9, wherein communication with the circuit tracer receiver is unidirectional such that the circuit tracer receiver does not communicate back (e.g., no acknowledgement receipt, no handshake, etc.) to the inductive clamp.
  wherein the communication is not over any of: Bluetooth, wireless communication protocol, or bi-directional communication protocol.

The embodiment of embodiment 9, wherein the sequence of data signals is received and processed by the circuit tracer receiver and displayed on its visual display.
  In some embodiments, wherein the visual display indicates the amperage measured by the inductive clamp. In other embodiments, other measurement values are displayed. In yet other embodiments, other information conveyed by the inductive clamp is displayed or otherwise processed (if not displayed) at the circuit tracer receiver.

The embodiment of embodiment 9, wherein the inductive clamp is substituted with a circuit tracer transmitter as described in any one of embodiments 1, 2, 5, or 8 (or their appropriate respective sub-embodiments deriving therefrom); and the induction unit comprises one or more circuitry or electrical components that generate the tracing signal on the conductor being tested and one or more circuitry or electrical components that sense a current in the conductor being tested.

Embodiment 10

An inductive clamp configured to communicate with at least a circuit tracer receiver, the inductive clamp comprising executable-instructions that when executed by a microcontroller, cause the inductive clamp to:
  communicates data over a conductor that is being tested, wherein the conductor communicatively couples the inductive clamp and the circuit tracer receiver; and
  measure current flowing in the conductor;
  wherein the communicating of the data over the conductor comprises:
    inducing, by an induction unit of the inductive clamp, a sequence of data signals (in a tracing signal) onto the conductor;
    wherein the same induction unit is configured to measure current flowing in the conductor;
  wherein the circuit tracer receiver is equipped with a communication interface to receive the sequence of data signals on the conductor and process the sequence by a microcontroller (or other circuitry) in the circuit tracer receiver.

The embodiment of embodiment 10, wherein the inductive clamp includes one or more features as described in any one of embodiments 1, 2, 5, or 8 (or their appropriate respective sub-embodiments deriving therefrom); and the induction unit comprises one or more circuitry or electrical components that generate the tracing signal on the conductor being tested and one or more circuitry or electrical components that sense a current in the conductor being tested.

Embodiment 11

An inductive device (e.g., an inductive clamp, an inductive fork, or other device with an induction unit) configured to communicate with at least a circuit tracer receiver, the inductive device comprising executable-instructions that when executed by a microcontroller, cause the inductive device to:
  communicates data over a conductor that is being tested, wherein the conductor communicatively couples the inductive device and the circuit tracer receiver; and
  measure current flowing in the conductor;
  wherein the communicating of the data over the conductor comprises:
    inducing, by an induction unit of the inductive device, a sequence of data signals (in a tracing signal) onto the conductor;
    wherein the same induction unit is configured to measure current flowing in the conductor;
  wherein the circuit tracer receiver is equipped with a communication interface to receive the sequence of data signals on the conductor and process the sequence by a microcontroller (or other circuitry) in the circuit tracer receiver.

The embodiment of embodiment 11, wherein the inductive device includes one or more features as described in any one of embodiments 1, 2, 5, or 8 (or their appropriate respective sub-embodiments deriving therefrom); and the induction unit comprises one or more circuitry or electrical components that generate the tracing signal on the conductor being tested and one or more circuitry or electrical components that sense a current in the conductor being tested.

Embodiment 12

A circuit tracer transmitter with integrated receptacle tester, comprising:
  a current sense circuit;
  a microcontroller;
  an indicator;
  wherein the current sense circuit is configured to sense a current and input data indicative of the current;
  wherein the microcontroller is configured to perform a set of tests on an electrical receptacle through a connection with the HOT, GROUND, and NEUTRAL lines of the receptacle; and
  wherein the connection with the lines of the receptacle is through an accessory plugged into one or more ports of the circuit tracer transmitter.

The embodiment of embodiment 12, wherein the indicator is one of a visual display, an audible output, or combination thereof, and wherein the circuit tracer transmitter (or other hand-held testing device) includes an additional screen display on a plane perpendicular to the existing visual display.

The embodiment of embodiment 12, wherein the perpendicular plane is on the bottom-end of the transmitter/testing device, and wherein the display is configured to allow for the display of images, icons, and/or characters.

The embodiment of embodiment 12, wherein the indicator is an LED light, wherein illumination of the LED light indicates continuity on the test leads.

The embodiment of embodiment 12, wherein the circuit tracer transmitter is further integrated with circuitry for load continuity testing to locate electrical wiring faults, comprising:
a line coupling transformer;
an output driver configured to drive the line coupling transformer;
wherein the current sense circuit is further configured to sense a current on a primary driver side of the line coupling transformer and input data indicative of the current;
wherein the microcontroller is further configured to conduct a continuity test by automatically comparing the input data to a threshold level of current and generating an alert using the indicator if the threshold level of current is met or exceeded unless inhibited; and
wherein the alert indicates continuity on test leads on a secondary driver side of the line coupling transformer.

The embodiment of embodiment 12, wherein the microcontroller executes instructions for receptacle testing, that cause a set of tests to be performed comprising:
(Test #1) Wired correctly;
(Test #2) Open Ground;
(Test #3) Reverse Polarity (HOT and NEUTRAL are swapped);
(Test #4) Open HOT;
(Test #5) Open NEUTRAL;
(Test #6) HOT and GROUND Reversed;
(Test #7) HOT on NEUTRAL with HOT open; and/or
(Test #8) open GFCI test.

Embodiment 13

A circuit tracer transmitter with integrated continuity testing for locating electrical wiring faults and an integrated 3-wire receptacle tester, comprising:
a line coupling transformer;
a current sense circuit;
a microcontroller;
an indicator;
an output driver configured to drive the line coupling transformer;
a wireless module configured to communicate an alert wirelessly to a display;
wherein the current sense circuit is configured to sense a current on a primary driver side of the line coupling transformer and input data indicative of the current;
wherein the microcontroller is configured to:
conduct a continuity test by automatically comparing the input data to a threshold level of current and generating the alert if the threshold level of current is met or exceeded unless inhibited; and
perform a set of tests on an electrical receptacle through a connection with the HOT, GROUND, and NEUTRAL lines of the receptacle; and
wherein the connection with the lines of the receptacle is through an accessory plugged into one or more ports of the circuit tracer transmitter.
wherein the alert indicates continuity on test leads on a secondary driver side of the line coupling transformer.

We claim:

1. A circuit tracer transmitter with integrated continuity testing for locating electrical wiring faults, comprising:
a line coupling transformer;
a current sense circuit configured to sense a current on a primary driver side of the line coupling transformer and input data indicative of the current;
an indicator;
an output driver configured to drive the line coupling transformer; and
a microcontroller configured to conduct a continuity test by automatically comparing the input data to a threshold level of current and generating an alert using the indicator when the threshold level of current is met or exceeded unless inhibited,
wherein the alert indicates continuity on test leads on a secondary driver side of the line coupling transformer.

2. The circuit tracer transmitter of claim 1, further comprising:
a voltage detection circuit on the secondary driver side of the line coupling transformer, wherein the continuity test is inhibited when a live circuit is detected by the voltage detection circuit.

3. The circuit tracer transmitter of claim 1, wherein:
the current sense circuit is configured to measure a current draw input to the output driver; or
the current sense circuit is configured to measure a current draw output from the output driver.

4. The circuit tracer transmitter of claim 1, wherein the current sense circuit comprises:
an analog to digital converter configured to send a digital value as the input data indicative of the current.

5. The circuit tracer transmitter of claim 1, further comprising:
a voltage detection circuit on the secondary driver side of the line coupling transformer, wherein the continuity test is inhibited when a live circuit is detected by the voltage detection circuit, wherein detection of the live circuit causes the alert; or
a voltage detection circuit on the secondary driver side of the line coupling transformer, wherein the continuity test is inhibited when a live circuit is detected by the voltage detection circuit, wherein detection of a live circuit causes the alert comprising at least one of a displayed image, icon, or character, an illuminated LED, audio alert, or combination thereof.

6. The circuit tracer transmitter of claim 1, wherein the alert comprises a visual output, and wherein the indicator comprises:
a first screen display; and
a second screen display on a plane perpendicular to the first screen display, wherein the perpendicular plane is on a bottom-end of the circuit tracer transmitter.

7. The circuit tracer transmitter of claim 1, wherein:
the alert comprises a visual output, and wherein the indicator comprises a screen display configured to allow for display of images, icons, and/or characters; or
the indicator comprises a LED light, wherein illumination of the LED light indicates continuity on the test leads; or the indicator comprises a buzzer, wherein sound emitted from the buzzer indicates continuity on the test leads.

8. The circuit tracer transmitter of claim 1, further comprising:
a wireless module configured to communicate the alert wirelessly to a screen display physically apart from the circuit tracer transmitter.

9. The circuit tracer transmitter of claim 1, further comprising:
an inductive clamp;
tracing circuitry configured to drive a tracing signal into the inductive clamp, wherein the inductive clamp is used to measure current flowing in a conductor subject to the continuity test conducted by the microcontroller; and
a current transformer function circuitry configured to detect a magnetic field as the current flows through the conductor and convert the detection into an amperage value;
wherein the indicator is configured to display the amperage value.

10. The circuit tracer transmitter of claim 1, further comprising:
an inductive clamp comprising a current transformer function circuitry; and
tracing circuitry configured to drive a tracing signal into the inductive clamp,
wherein the inductive clamp is used to measure current flowing in a conductor subject to the continuity test conducted by the microcontroller.

11. The circuit tracer transmitter of claim 1, further comprising:
an inductive clamp comprising a current transformer function circuitry and the indicator; and
tracing circuitry configured to drive a tracing signal into the inductive clamp, wherein the inductive clamp is used to measure current flowing in a conductor subject to the continuity test conducted by the microcontroller.

12. A method of performing a continuity test using a circuit tracer transmitter with integrated continuity testing for locating electrical wiring faults, comprising:
sensing, by a current sense circuit, a current on a primary driver side of a transformer;
receiving, by a microcontroller, input data indicative of the current;
comparing, by the microcontroller, the input data to a threshold level of current; and
generating, by the microcontroller and using an indicator, an alert if the threshold level of current is met or exceeded, wherein the alert indicates continuity on test leads on a secondary driver side of the transformer.

13. The method of claim 12, wherein:
the transformer comprises a line coupling transformer, and wherein sensing by the current sense circuit is done at an input to an output driver driving the line coupling transformer; or
the transformer comprises a line coupling transformer, and wherein sensing by the current sense circuit is done at an output of an output driver driving the line coupling transformer.

14. The method of claim 12, further comprising:
inhibiting, by the microcontroller, a continuity test if a live circuit is detected by a voltage detection circuit on the secondary driver side of the transformer; and
generating, by the microcontroller, a second alert consequent to detecting the live circuit.

15. The method of claim 12, further comprising:
sending, by the microcontroller, the alert to a wireless module configured to communicate via at least one of Bluetooth, Wi-Fi, or combination thereof;
wirelessly send, the alert to a screen display physically separate from the microcontroller.

16. A circuit tracer kit with integrated continuity testing for locating electrical wiring faults, the circuit tracer kit comprising:
a circuit tracer receiver; and
a circuit tracer transmitter apart from the circuit tracer receiver, wherein circuit tracer transmitter comprises at least:
a line coupling transformer comprising a primary driver side and a secondary driver side;
a current sense circuit configured to sense a current on the primary driver side of the line coupling transformer and input data indicative of the current;
a voltage detection circuit on the secondary driver side of the line coupling transformer, wherein the voltage detection circuit is configured to detect if the circuit tracer transmitter is live, then inhibit a continuity test;
an indicator;
an output driver configured to drive the line coupling transformer; and
a circuit component configured to trigger execution of the continuity test by automatically comparing the input data to a threshold level of current and generating an alert using the indicator when the threshold level of current is satisfied absent the continuity test having been inhibited,
wherein the alert indicates continuity on test leads on a secondary driver side of the line coupling transformer.

17. A circuit tracer kit with integrated continuity testing for locating electrical wiring faults in a conductor being tested, the circuit tracer kit comprising:
an induction device equipped with an induction unit comprising circuitry configured to induce a sequence of data signals in a tracing signal onto the conductor being tested, wherein the induction unit is further equipped with circuitry configured to measure current flowing in the conductor; and
a circuit tracer receiver equipped with a communication interface to receive the sequence of data signals in the tracing signal on the conductor and process the sequence.

18. The circuit tracer kit of claim 17, wherein the induction unit comprises:
a first electronics to drive a current that induces the sequence of data signals onto the conductor; and
a second electronics to sense the current flowing in the conductor;
wherein:
the first electronics and the second electronics run concurrently to perform current measurement and induce the tracing signal at the same time; or
the first electronics and the second electronics alternate operations by the second electronics performing current measurement and then later the first electronics inducing the tracing signal based on the current measurement.

19. The circuit tracer kit of claim 17, wherein one or more of:
the tracing signal from the induction device to the circuit tracer receiver indicates whether the conductor is energized or de-energized, and wherein the induction unit is further equipped with circuitry configured to measure current flowing in the conductor subject to the integrated continuity testing;

a first pulse width of the tracing signal indicates a first numeric value, and a second pulse width of the tracing signal indicates a second numeric value;

the tracing signal includes a frame start pulse, a frame end pulse, and a data message communicated between the frame start pulse and the frame end pulse; or the circuit tracer receiver comprises a memory storing a mapping table to use with processing of the sequence of data signals.

20. The circuit tracer kit of claim 17, wherein one or more of:

the processing, by the circuit tracer receiver, of the sequence of data signals is performed without requiring a handshake with the induction device;

communication with the circuit tracer receiver is unidirectional with the induction device; or the induction device does not fully encircle the conductor being tested.

\* \* \* \* \*